US009983058B2

(12) United States Patent
Wang et al.

(10) Patent No.: US 9,983,058 B2
(45) Date of Patent: May 29, 2018

(54) TUNABLE NEAR-INFRARED EMITTERS AND METHODS

(71) Applicants: YuHuang Wang, Laurel, MD (US); Hyejin Kwon, Greenbelt, MD (US); Mijin Kim, Silver Spring, MD (US)

(72) Inventors: YuHuang Wang, Laurel, MD (US); Hyejin Kwon, Greenbelt, MD (US); Mijin Kim, Silver Spring, MD (US)

(73) Assignee: University of Maryland, College Park, College Park, MD (US)

(*) Notice: Subject to any disclaimer, the term of this patent is extended or adjusted under 35 U.S.C. 154(b) by 0 days. days.

(21) Appl. No.: 15/590,397

(22) Filed: May 9, 2017

(65) Prior Publication Data
US 2017/0322081 A1 Nov. 9, 2017

Related U.S. Application Data

(60) Provisional application No. 62/333,372, filed on May 9, 2016.

(51) Int. Cl.
| | |
|---|---|
| *G01J 3/10* | (2006.01) |
| *H01L 49/00* | (2006.01) |
| *H01L 51/52* | (2006.01) |
| *B01J 19/12* | (2006.01) |
| *B82Y 20/00* | (2011.01) |

(52) U.S. Cl.
CPC ............ *G01J 3/108* (2013.01); *B01J 19/128* (2013.01); *H01L 49/006* (2013.01); *H01L 51/5262* (2013.01); *B82Y 20/00* (2013.01)

(58) Field of Classification Search
USPC .................................................. 250/504 R
See application file for complete search history.

(56) References Cited

U.S. PATENT DOCUMENTS

| | | | | |
|---|---|---|---|---|
| 8,803,094 | B2 * | 8/2014 | Leeds | ............... C09K 11/65 |
| | | | | 250/339.01 |
| 8,980,216 | B2 * | 3/2015 | Wang | ................. C07C 57/40 |
| | | | | 423/447.1 |

OTHER PUBLICATIONS

Piao; et al., "Brightening of carbon nanotube photoluminescence through the incorporation of sp3 defects", Nat. Chem. 2013, 5, pp. 840-845.*
Akizuki, N. et al. (2015) "*Efficient near-infrared up-conversion photoluminescence in carbon nanotubes,*" Nat. Commun. 6.
Alivisatos, A.P. (1996) "*Semiconductor clusters, nanocrystals, and quantum dots,*" Science 271:933—Alivisatos, A.P. (1996) "*Semiconductor clusters, nanocrystals, and quantum dots,*" Science 271:933937.
Ao, G. et al. (2014) "*DNA-Controlled Partition of Carbon Nanotubes in Polymer Aqueous Two-Phase Systems,*" J. Am. Chem. Soc. 136:10383-10392.
Artem, R.C. et al. (1996) "*The problem of the quantitative evaluation of the inductive effect: correlation analysis,*" Russ. Chem. Rev. 65:641.

(Continued)

*Primary Examiner* — Phillip A Johnston
(74) *Attorney, Agent, or Firm* — William C. Schrot; AuerbachSchrot LLC

(57) ABSTRACT

The present invention relates to near-infrared quantum emitters, and in particular carbon nanostructures with chemically incorporated fluorescent defects, and methods of synthesizing near-infrared emitting nanostructures.

21 Claims, 23 Drawing Sheets
(3 of 23 Drawing Sheet(s) Filed in Color)

(56) References Cited

OTHER PUBLICATIONS

Bachilo, S.M. (2002) "Structure-Assigned Optical Spectra of Single-Walled Carbon Nanotubes," Science 298:2361-2366.

Brozena, A.H. et al. (2014) "Controlled defects in semiconducting carbon nanotubes promote efficient generation and luminescence of trions," ACS Nano 8:4239-4247.

Capaz, R.B. et al. (2006) "Diameter and chirality dependence of exciton properties in carbon nanotubes," Phys. Rev. B 74, 121401 (2006).

Chan, W.C.W. & Nie, S. (1998) "Quantum dot bioconjugates for ultrasensitive nonisotopic detection," Science 281:2016-2018.

Cognet et al. (2007) "Stepwise quenching of exciton fluorescence in carbon nanotubes by single-molecule reactions," Science 316:1465-1468.

Deng, S. et al. (2011) "Confined propagation of covalent chemical reactions on single-walled carbon nanotubes," Nat. Commun. 2.

Dresselhaus, M.S. et al. (2007) "Raman Spectroscopy of Carbon Nanotubes in 1997 and 2007," J. Phys. Chem. C 111:17887-17893.

Erwin, S.C. et al. (2005) "Doping semiconductor nanocrystals," Nature 436:91-94.

Ghosh, S. et al. (2010) "Oxygen doping modifies near-infrared band gaps in fluorescent single-walled carbon nanotubes," Science 330:1656-1659.

Goldsmith et al. (2007) "Conductance-controlled point functionalization of single-walled carbon nanotubes," Science 315:77-81.

Gruber, A. et al. (1997) "Scanning confocal optical microscopy and magnetic resonance on single defect centers," Science 276:2012-2014.

Hansch, C. et al. (1991) "A survey of Hammett substituent constants and resonance and field parameters," Chem. Rev. 91:165-195.

Heller, D.A. et al. (2006) "Optical Detection of DNA Conformational Polymorphism on Single-Walled Carbon Nanotubes," Science 311:508-511.

Hong, G. et al. (2012) "Multifunctional in vivo vascular imaging using near-infrared II fluorescence," Nat. Med. 18:1841-1846.

Kamat, P.V. (2008) "Quantum dot solar cells. Semiconductor nanocrystals as light harvesters," J. Phys. Chem. C 112:18737-18753.

Kropp, P.J. (1984) "Photobehavior of alkyl halides in solution: radical, carbocation, and carbene intermediates," Acc. Chem. Res. 17:131-137.

Liang, F. et al. (2004) "Convenient Route to Functionalized Carbon Nanotubes," Nano Lett. 4:1257-1260.

Liu, H. et al. (2011) "Large-scale single-chirality separation of single-wall carbon nanotubes by simple gel chromatography," Nat. Commun. 2.

O'Connell, M.J. (2002) "Band Gap Fluorescence from Individual Single-Walled Carbon Nanotubes," Science 297:593-596.

Piao, Y.M. et al. (2013) "Brightening of carbon nanotube photoluminescence through the incoporation of sp3 defects," Nat. Chem. 5:840-845.

Rossetti, R. et al. (1983) "Quantum size effects in the redox potentials, resonance Raman spectra, and electronic spectra of cadmium sulfide crystallites in aqueous solution," J. Chem. Phys. 79:1086-1088.

Sanchez-Valencia, J.R. e et al. (2014) "Controlled synthesis of single-chirality carbon nanotubes," Nature 512:61-64.

Shirasaki, Y. et al. (2013) "Emergence of colloidal quantum-dot light-emitting technologies," Nat. Photon. 7:13-23.

Tu, X. et al. (2009) "DNA sequence motifs for structure-specific recognition and separation of carbon nanotubes," Nature 460:250-253.

Wang, F. et al. (2005) "The Optical Resonances in Carbon Nanotubes Arise from Excitons" Science 308:838-841.

Xiao, Z. et al. (2013) "Radical Addition of Perfluoroalkyl Iodides to Alkenes and Alkynes Initiated by Sodium Dithionite in an Aqueous Solution in the Presence of a Novel Fluorosurfactant," Chin J Chem. 31:939 (Abstract).

Yin, Y. & Alivisatos, A.P. (2005) "Colloidal nanocrystal synthesis and the organic-inorganic interface," Nature 437:664-670.

Zhang, C.-P. et al. (2012) "Progress in fluoroalkylation of organic compounds via sulfinatodehalogenation initiation system," Chem. Soc. Rev. 41:4536-4559.

Zhang, Y. et al. (2013) "Propagative Sidewall Alkylcarboxylation that Induces Red-Shifted Near-IR Photoluminescence in Single-Walled Carbon Nanotubes," J. Phys. Chem. Lett. 4:826-830.

Zheng, M. & Diner, B.A. (2004) "Solution Redox Chemistry of Carbon Nanotubes," J. Am. Chem. Soc. 126:15490-15494.

\* cited by examiner

| R-(6,5)-SWCNT | $E_{11}$ (nm) | $E_{11}^-$ (nm) | $E_{11}-E_{11}^-$ (meV) | $\sigma'$ (ref) | $\sigma'$ (calc) |
|---|---|---|---|---|---|
| I-CF$_3$ | 981 | 1158 | 193 | 0.44 | 4.4766 |
| I-CF$_2$CF$_2$CF$_3$ | 983 | 1158 | 191 | 0.44 | 4.4766 |
| I-CF$_2$CF$_2$CF$_2$CF$_2$CF$_3$ | 982 | 1158 | 192 | - | 4.8668 |
| I-CF$_2$CF$_2$CF$_2$CF$_2$CF$_2$CF$_2$CF$_2$CF$_3$ | 982 | 1156 | 190 | - | 5.1057 |
| I-CH$_2$CH$_2$CF$_2$CF$_2$CF$_2$CF$_3$ | 982 | 1133 | 168 | - | 1.0858 |
| I-CH$_2$CH$_2$CF$_2$CF$_2$CF$_2$CF$_2$CF$_2$CF$_2$CF$_3$ | 983 | 1137 | 171 | - | 1.3264 |
| I-CH$_2$CH$_2$CH$_2$CH$_3$ | 980 | 1093 | 131 | 0.01 | -0.6952 |
| I-CH$_2$CH$_2$CH$_2$CH$_2$CH$_2$CH$_3$ | 981 | 1096 | 133 | 0.03 | -0.7745 |

TUNABLE NEAR-INFRARED EMITTERS AND METHODS

CROSS-REFERENCE TO RELATED APPLICATIONS

This application is based on U.S. Provisional Patent Application Ser. No. 62/333,372, filed May 9, 2016, titled "*Molecularly Tunable Near-Infrared Emitters and Methods of Creating the Same*," which application is incorporated herein by reference in its entirety and to which priority is claimed.

STATEMENT REGARDING FEDERALLY SPONSORED RESEARCH OR DEVELOPMENT

This invention was made with government support by the National Science Foundation (NSF) under CHE1507974 and CHE1055514; by the National Institutes of Health (NIH) under 1R01GM114167; and by the Air Force Office of Scientific Research (AFOSR) under FA95501610150. The United States government has certain rights in this invention.

FIELD OF THE INVENTION

The present invention relates to near-infrared quantum emitters, and in particular carbon nanostructures with chemically incorporated fluorescent defects, and methods of synthesizing near-infrared emitting nanostructures.

BACKGROUND OF THE INVENTION

The excited states of many semiconducting nanostructures, such as carbon nanotubes (CNTs), are characterized by excitons, electron-hole pairs bound by Coulomb interactions (Wang, F. et al. (2005) "*The Optical Resonances in Carbon Nanotubes Arise from Excitons*" Science 308:838-841). Excitons are hydrogen-atom-like quasi-particles, each carrying a quantum of electronic excitation energy. An exciton can return to the ground state by emitting a photon, producing photoluminescence (PL), or by falling into a "dark" state from which the energy is lost as heat. The ability to control the fate of excitons and their energy is crucial to imaging (Hong, G. et al. (2012) "*Multifunctional in vivo vascular imaging using near-infrared II fluorescence*," Nat. Med. 18:1841-1846; Chan, W. C. W. & Nie, S. (1998) "*Quantum dot bioconjugates for ultrasensitive nonisotopic detection*," Science 281:2016-2018), sensing (Heller, D. A. et al. (2006) "*Optical Detection of DNA Conformational Polymorphism on Single-Walled Carbon Nanotubes*," Science 311:508-511), photovoltaics (Kamat, P. V. (2008) "*Quantum dot solar cells. Semiconductor nanocrystals as light harvesters*," J. Phys. Chem. C 112:18737-18753), lighting and display (Shirasaki, Y. et al. (2013) "*Emergence of colloidal quantum-dot light-emitting technologies*," Nat. Photon. 7:13-23), and many other electronic applications.

Over the last few decades, two primary approaches have been developed to tailor the exciton properties within a nanocrystal—quantum confinement and doping. Quantum confinement has motivated the development of many synthetic approaches that control the size and shape of nanocrystals, and consequently their electronic and optical properties (Rossetti, R. et al. (1983) "*Quantum size effects in the redox potentials, resonance Raman spectra, and electronic spectra of cadmium sulfide crystallites in aqueous solution*," J. Chem. Phys. 79:1086-1088; Alivisatos, A. P. (1996) "*Semiconductor clusters, nanocrystals, and quantum dots*," Science 271:933-937; Yin, Y. & Alivisatos, A. P. (2005) "*Colloidal nanocrystal synthesis and the organic-inorganic interface*," Nature 437:664-670). Doping modifies the electronic structure of the host crystal and the examples include nitrogen-vacancy in diamond (Gruber, A. et al. (1997) "*Scanning confocal optical microscopy and magnetic resonance on single defect centers*," Science 276:2012-2014) and metal ion-doped nanocrystals (Erwin, S. C. et al. (2005) "*Doping semiconductor nanocrystals*," Nature 436:91-94).

In the case of single-walled carbon nanotubes (SWCNTs), the excitonic properties depend on both the diameter and chiral angle of each nanotube crystal, collectively known as chirality, which may be denoted by a pair of integers (n,m) (see O'Connell, M. J. (2002) "*Band Gap Fluorescence from Individual Single-Walled Carbon Nanotubes*," Science 297:593-596; Bachilo, S. M. (2002) "*Structure-Assigned Optical Spectra of Single-Walled Carbon Nanotubes*," Science 298:2361-2366). It has recently been demonstrated that the optical properties of SWCNTs can be modified by doping with oxygen (Ghosh, S. et al. (2010) "*Oxygen doping modifies near-infrared band gaps in fluorescent single-walled carbon nanotubes*," Science 330:1656-1659) or by the incorporation of defects through diazonium chemistry (Piao, Y. et al. (2013) "*Brightening of carbon nanotube photoluminescence through the incorporation of sp3 defects*," Nat. Chem. 5:840-845). These defects can induce a new near-infrared emission (Ghosh, S. et al. (2010) "*Oxygen doping modifies near-infrared band gaps in fluorescent single-walled carbon nanotubes*," Science 330:1656-1659), brighten dark excitons (Piao, Y. et al. (2013) "*Brightening of carbon nanotube photoluminescence through the incorporation of sp3 defects*," Nat. Chem. 5:840-845), facilitate up conversion (anti-stoke shift) (Akizuki, N. et al. (2015) "*Efficient near-infrared up-conversion photoluminescence in carbon nanotubes*," Nat. Commun. 6), and stabilize trions at room temperature (Brozena, A. H. et al. (2014) "*Controlled defects in semiconducting carbon nanotubes promote efficient generation and luminescence of trions*," ACS Nano 8:4239-4247), thus making them particularly interesting for emergent photonic applications. However, these conventional methods for defect creation have thus far been bound by the extremely limited chemical and optical tunability. In particular, oxygen doping leads to mixed ether and epoxide structures, and diazonium chemistry works only for specific aryl groups and monovalent bonding, and has relatively low reaction rates. Moreover, it has been demonstrated that diazonium chemistry and oxidative reactions occur on a SWCNT sidewall at completely random atomic sites (see Goldsmith et al. (2007) "*Conductance-controlled point functionalization of single-walled carbon nanotubes*," Science 315:77-81); Cognet et al. (2007) "*Stepwise quenching of exciton fluorescence in carbon nanotubes by single-molecule reactions*," Science 316:1465-1468). The covalent modification of even a single site utilizing such methodologies results in a substantial drop of electrical conductance (Goldsmith et al. (2007), *Conductance-controlled point functionalization of single-walled carbon nanotubes*," Science 315:77-81) and stepwise quenching of exciton fluorescence in semiconducting nanotubes (Cognet et al. (2007), *Stepwise quenching of exciton fluorescence in carbon nanotubes by single-molecule reactions*," Science 316:1465-1468). As such, prior methodologies utilizing defects pale in comparison with the large number of quantum dots that have been synthesized based on the quantum confinement effect. The use of defects for materials engineering has therefore not been achieved by such prior methodologies.

Accordingly, there is a need for new near-infrared emitters and synthetic approaches for creating such emitters that overcome some or all of the difficulties and limitations of conventional approaches.

SUMMARY OF THE INVENTION

The present invention relates to a new series of near-infrared emitters and a versatile new synthetic approach for creating near-infrared emitters from a single SWCNT material through molecular engineering of covalently attached surface functional groups. In accordance with disclosed methodologies, the synthesis of more than thirty new fluorescent nanostructures is demonstrated from SWCNTs of the same crystal structure by creating molecularly tunable fluorescent quantum defects in the $sp^3$ carbon lattice. Each of the new synthetic nanostructures may be viewed as a diamond-in-graphene structure reminiscent of an island in an electron sea.

In accordance with disclosed embodiments, the present invention relates to a method of synthesizing a near infrared emitter comprising the steps of: reacting a carbon nanostructure with a halogen-containing hydrocarbon precursor and thereby creating $sp^3$ defects in said carbon nanostructure, wherein covalent functionalization produces fluorescent defects that emit near-infrared radiation having wavelengths between about 800 nm and about 2500 nm. In some implementations, the $sp^3$ defects are created in a pristine carbon nanostructure during said reacting step.

In some embodiments, the carbon nanostructure is a carbon nanotube (CNT), e.g., a single-walled CNT (SWCNT). In some implementations, the CNT has a diameter of between about 0.5 nm and about 1.6 nm.

In some embodiments, the halogen-containing hydrocarbon precursor is a chlorine, a bromide, an iodide or a di-halide alkyl precursor. In some embodiments, the halogen-containing hydrocarbon precursor is a polymer containing the reactive halogen. In some implementations, the halogen-containing precursor is a polyoligonucleotide containing the reactive halogen.

In some embodiments, the halogen-containing hydrocarbon precursor is an alkyl halide. In some implementations, said reacting step further comprises combining said carbon nanostructure with sodium dithionite ($Na_2S_2O_4$), wherein the sodium dithionite activates the alkyl precursor.

In some embodiments, the halogen-containing hydrocarbon precursor is an iodide or di-halide aryl precursor. In some implementations, the method provides for exposing the carbon nanostructure and the aryl precursor to electromagnetic radiation having a wavelength(s) of between about 300 nm and about 1200 nm, wherein the wavelength(s) is resonant with the carbon nanostructures. The electromagnetic radiation activates the aryl precursor.

In some embodiments, the created $sp^3$ defects are selected from the group consisting of monovalent alkyl defects, divalent alkyl defects, monovalent aryl defects, and divalent aryl defects. In some implementations, the covalently functionalized carbon nanostructure is functionalized with an alkyl group or an aryl group. In some implementations, the covalently functionalized carbon nanostructure is functionalized with —$(CH_2)_n(CF_2)_mCF_3$, wherein n is an integer between 0 and 10, and wherein m is an integer between 0 and 10. In some implementations, the covalently function-alized carbon nanostructure is functionalized with —$(CH_2)_n$ $CH_3$, wherein n is an integer between 0 and 17.

The present invention also relates to synthetized near-infrared emitters. In accordance with some embodiments, a synthetic near-infrared emitter comprises a carbon nanostructure comprising $sp^3$ defects in a carbon lattice thereof, which are created via reaction with a halogen-containing hydrocarbon precursor. A functional group(s) is covalently bonded to the $sp^3$ defects to produce fluorescent defects that emit near-infrared radiation having wavelengths between about 800 nm and about 2500 nm.

In some embodiments, the carbon nanostructure is a carbon nanotube (CNT), e.g., a SWCNT. In some embodiments, the CNT has a diameter of between about 0.5 nm and about 1.6 nm.

In some embodiments, the near-infrared emitter comprises a functional group is selected from the group consisting of a monovalent alkyl group, a divalent alkyl group, a monovalent aryl group, and a divalent aryl group. In some implementations, the functional group is —$(CH_2)_n(CF_2)_mX$, wherein n is an integer between 0 and 17, and wherein m is an integer between 0 and 17, and wherein X is $CH_3$, $CF_3$, $NH2$, $N+(CH_2CH_3)_2$, or $COOH$. In some implementations, the functional group is —$(CH_2)_nCH_3$, wherein n is an integer between 0 and 10.

BRIEF DESCRIPTION OF THE DRAWINGS

The patent or application file contains at least one drawing/photograph executed in color. Copies of this patent or patent application publication with color drawing(s) will be provided by the Office upon request and payment of the necessary fee.

SWCNT (Panel a); (8,3)- and (8,4)-SWCNT (Panel b); (7,6)- and (8,4)-enriched SWCNTs (Panel c); and the mixed chirality of HiPco SWCNT (Panel d). Controlled sidewall alkylation induces new PL peaks in (6,5)-SWCNT-CF$_2$ (CF$_2$)$_4$ CF$_3$ (Panel e); (8,3)/(8,4)-SWCNT-CF$_2$(CF$_2$)$_4$CF$_3$ (Panel f); (7,6)/(8,4)-SWCNT-CF$_2$(CF$_2$)$_4$CF$_3$ (Panel g); and HiPco-SWCNT-CF$_2$(CF$_2$)$_4$CF$_3$ (Panel h). The nanotubes were stabilized in D$_2$O by 1 wt. % sodium dodecyl sulfate (CH$_3$(CH$_2$)$_{11}$SO$_4$Na).

Figure 6:
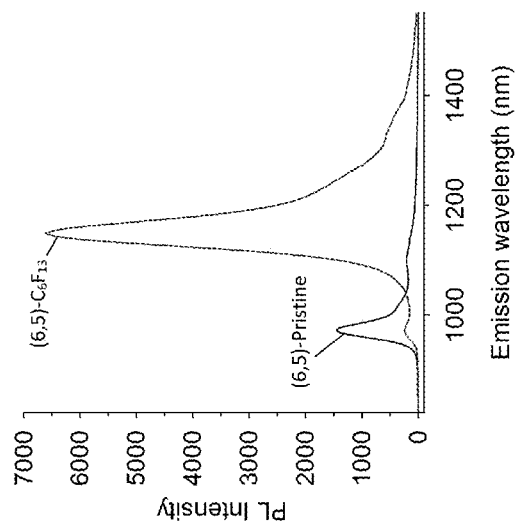

FIG. 6 illustrates graphically emission spectra of (6,5)-pristine and (6,5)-SWCNT-CF$_2$(CF$_2$)$_4$CF$_3$ and showing the brightening PL by more than an order of magnitude.

Figure 7:
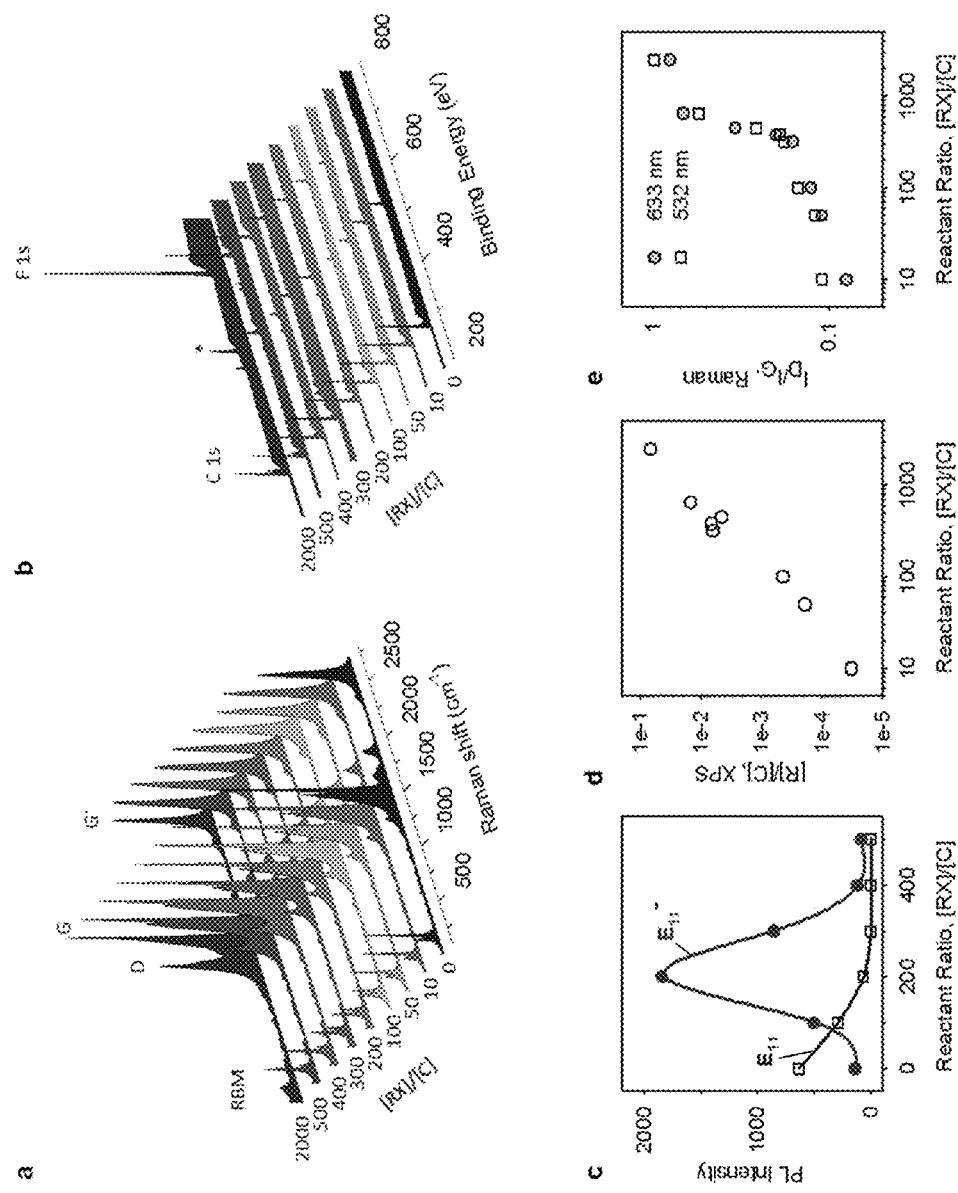

FIG. 7 illustrates correlated spectral characterization of functionalized SWCNTs at increasing molar reactant ratios of CF$_3$(CF$_2$)$_4$CF$_2$I (RX) to the mixed chirality of HiPco SWCNT carbon, including: Raman scattering (Panel a), wherein the excitation line is 532 nm; and X-ray photoelectron spectroscopy (XPS) taken at 25° C. (Panel b), wherein the O1s peak is marked with an asterisk (*). PL is illustrated graphically in Panel c. The ratio of covalently attached function group to nanotube carbon, [R]/[C], as determined from XPS, increases linearly with the reactant ratio, [RX]/[C], as shown in Panel d. Raman D/G ratio of SWCNT-CF$_2$(CF$_2$)$_4$CF$_3$ at increasing [RX]/[C] is illustrated in Panel e.

Figure 8:
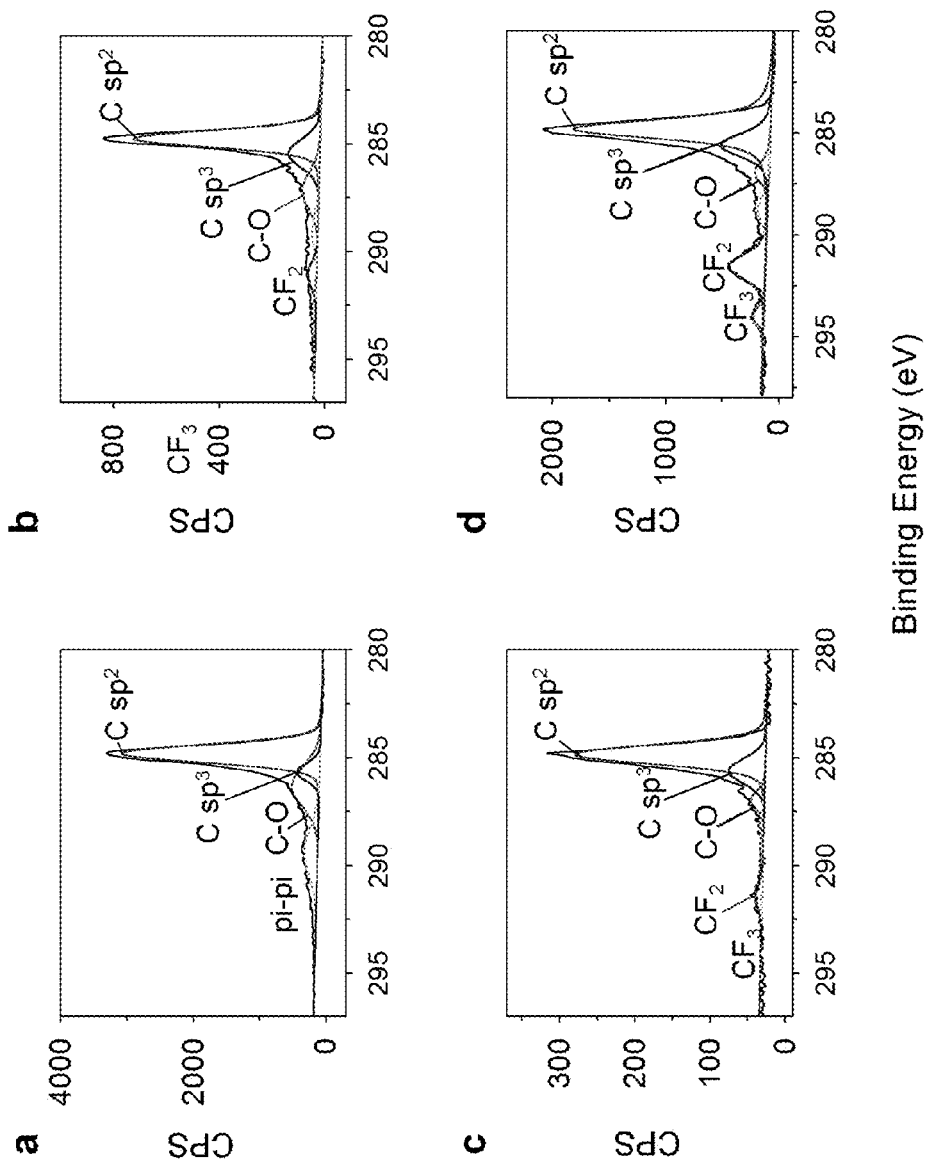

FIG. 8 illustrates high resolution XPS of C is at 175° C. for SWCNT-CF$_2$(CF$_2$)$_4$CF$_3$. Panel a: non-functionalized control; Panel b: [C]:[RX]=1:50; Panel c: 1:500; and Panel d: 1:2500. The nanotubes used were a sample of mixed chirality HiPco SWCNTs.

Figure 9:
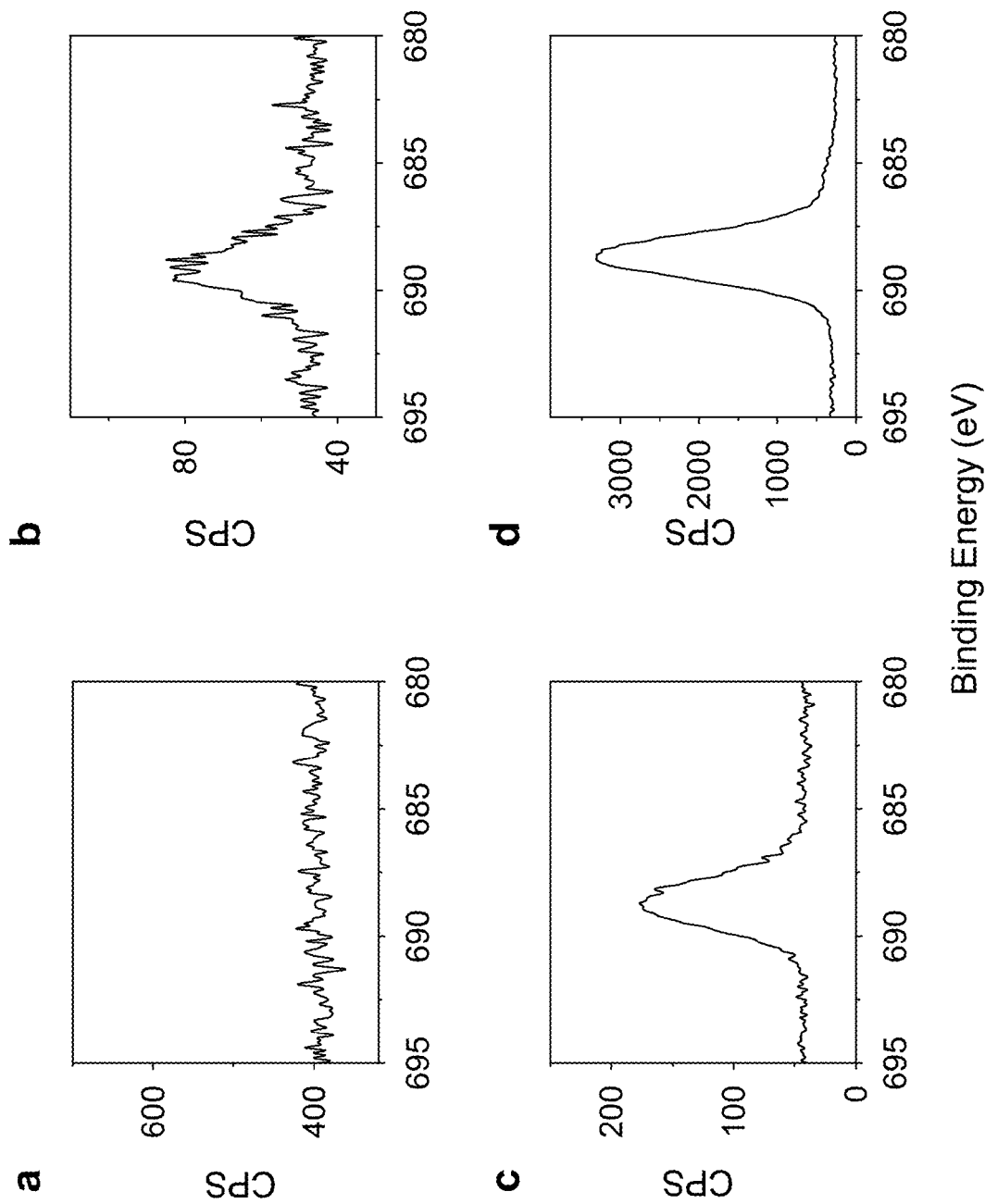

FIG. 9 illustrates high resolution XPS of F is at 175° C. for SWCNT-CF$_2$(CF$_2$)$_4$CF$_3$. Panel a: Non-functionalized control; Panel b: [C]:[RX]=1:50; Panel c: 1:500; and Panel d: 1:2500.

Figure 10:
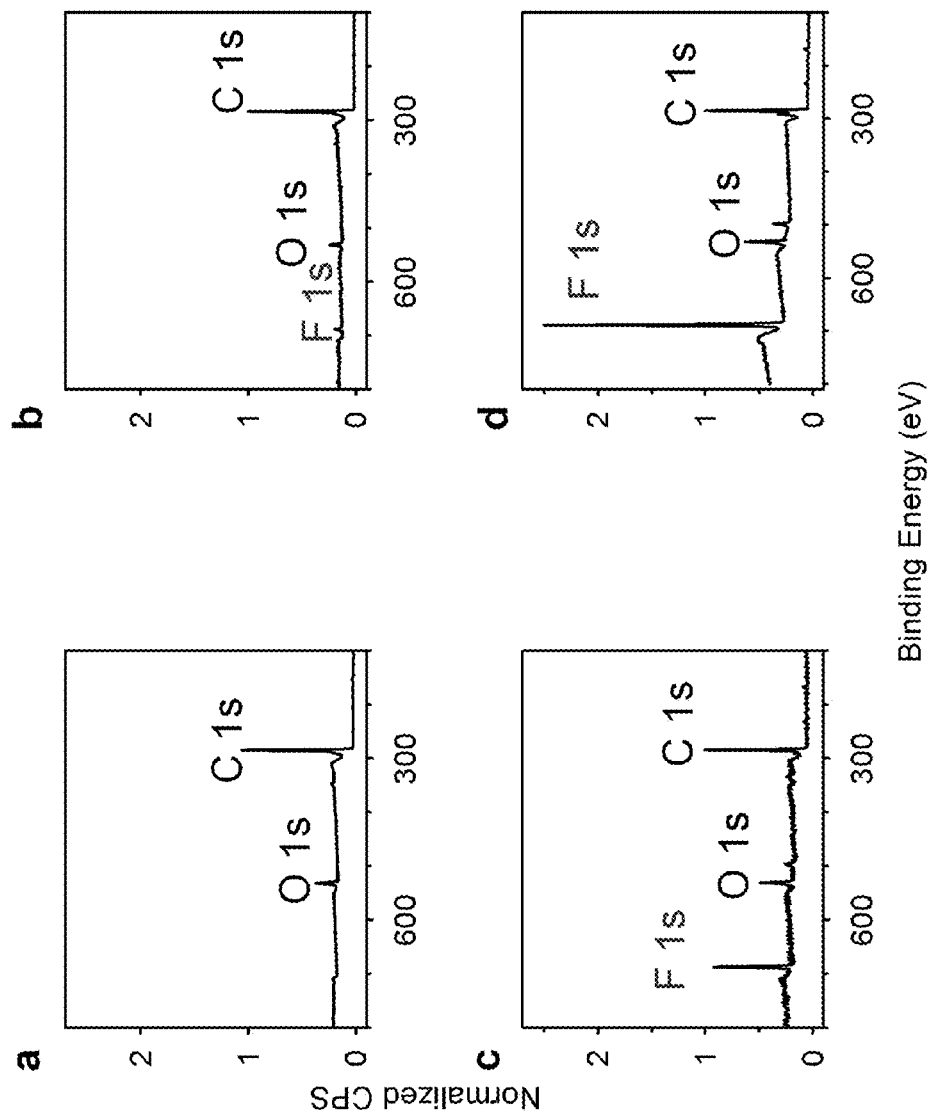

FIG. 10 illustrates high resolution XPS of full spectra at 175° C. for SWCNT-CF$_2$(CF$_2$)$_4$CF$_3$. Panel a: Non-functionalized control; Panel b: [C]:[RX]=1:50; Panel c: 1:500, and Panel d: 1:2500.

Figure 5:
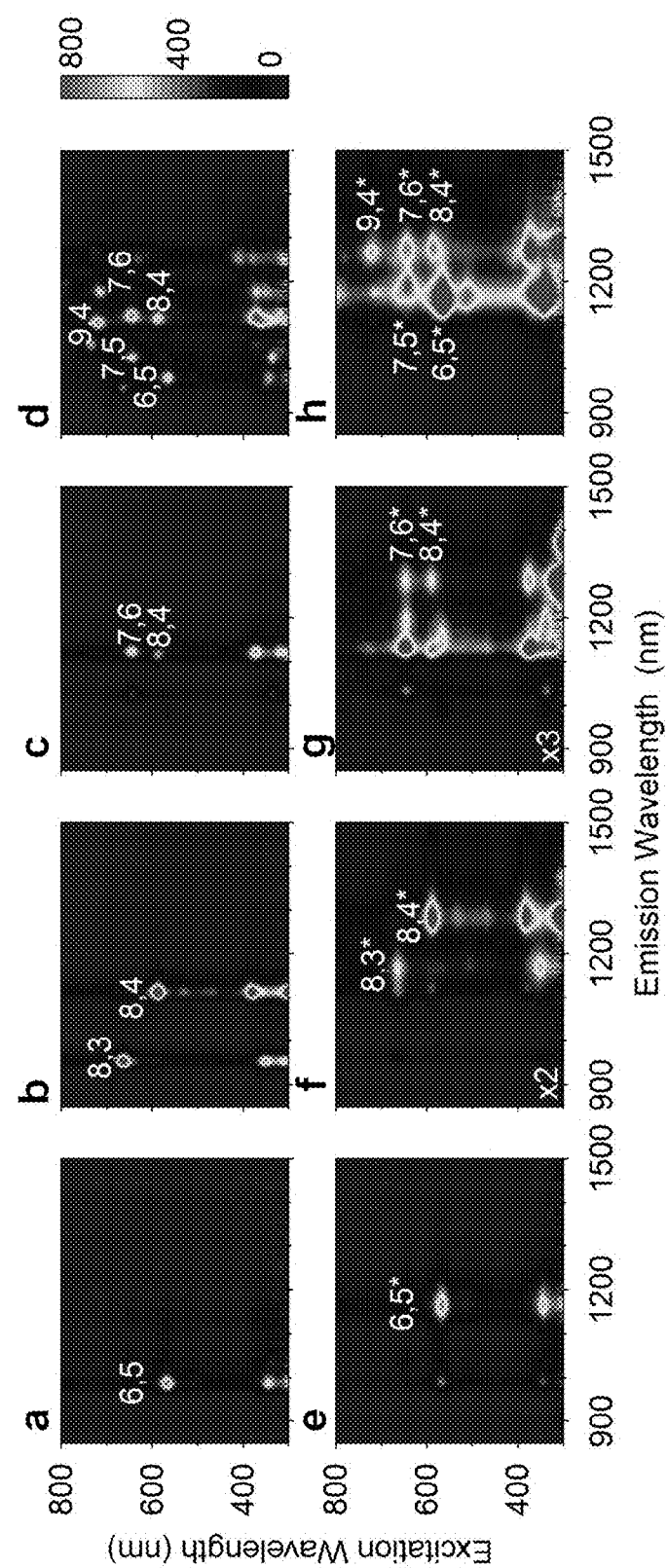
FIG. 5 illustrates nanotube structure-dependent defect photoluminescence. The excitation-emission maps of (6,5)-
Figure 11:
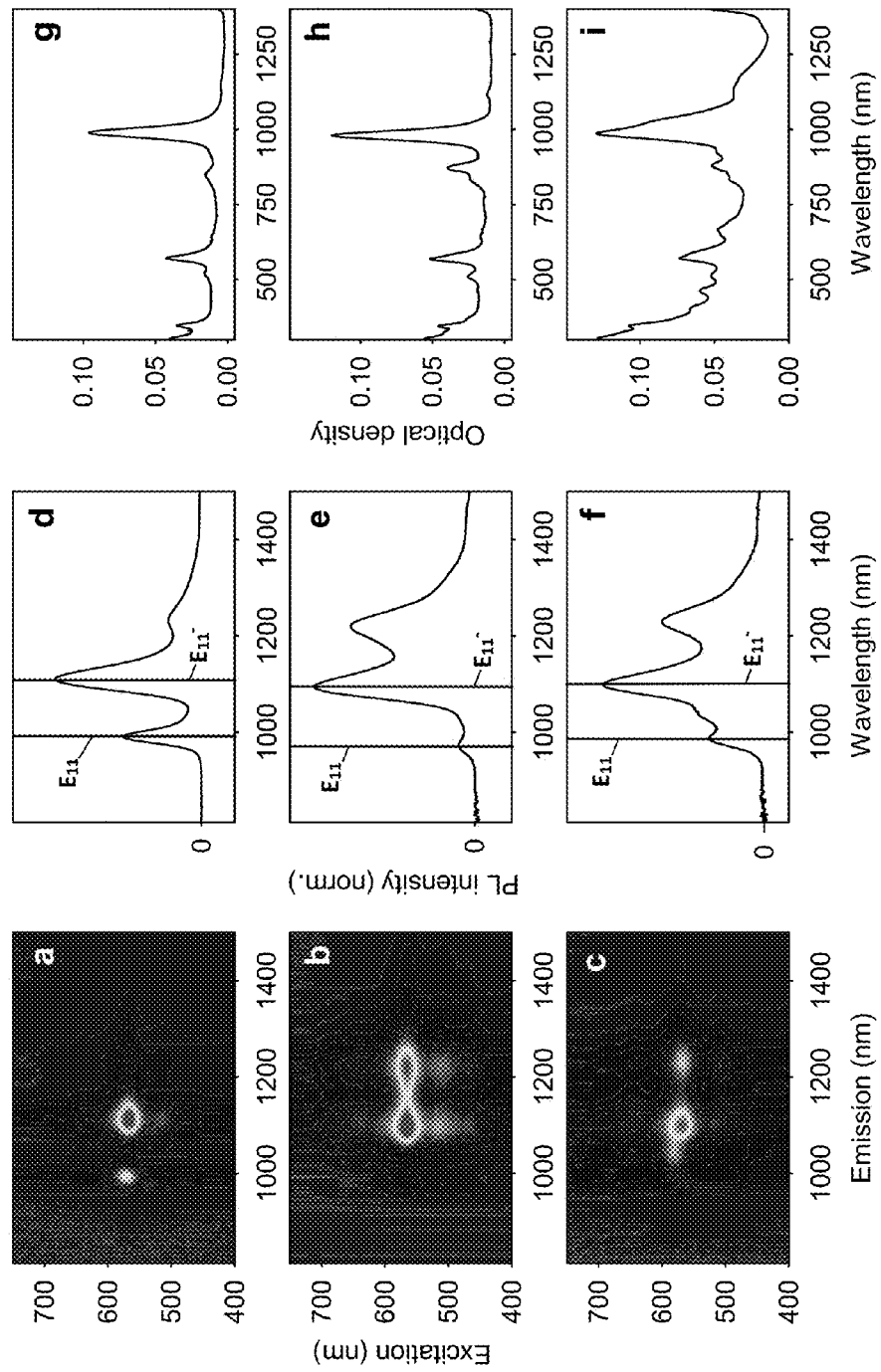

FIG. 11 illustrates the spectroscopic characterization of (6,5)-SWCNT-CH$_2$(CH$_2$)$_4$CH$_3$ stabilized in 1 wt./v % SDS-D$_2$O. Defect PL from the chemically tailored (6,5)-SWCNT is identified in the same emission energy regardless of the source of raw nanotube materials: two phase separation isolated CoMoCAT SG65i (Panel a, Panel d and Panel g), gel purified HiPco (Panel b, Panel e and Panel h), and unpurified CoMoCAT SG65i (Panel c, Panel f and Panel i). Panel a, Panel b, and Panel c: The excitation-emission PL map (coded in accordance with key of FIG. 5). Panel d, Panel e, and Panel f: 565 nm single excitation PL spectra. Panel g, Panel h, and Panel i: UV-vis-NIR absorption spectra.

Figure 12:
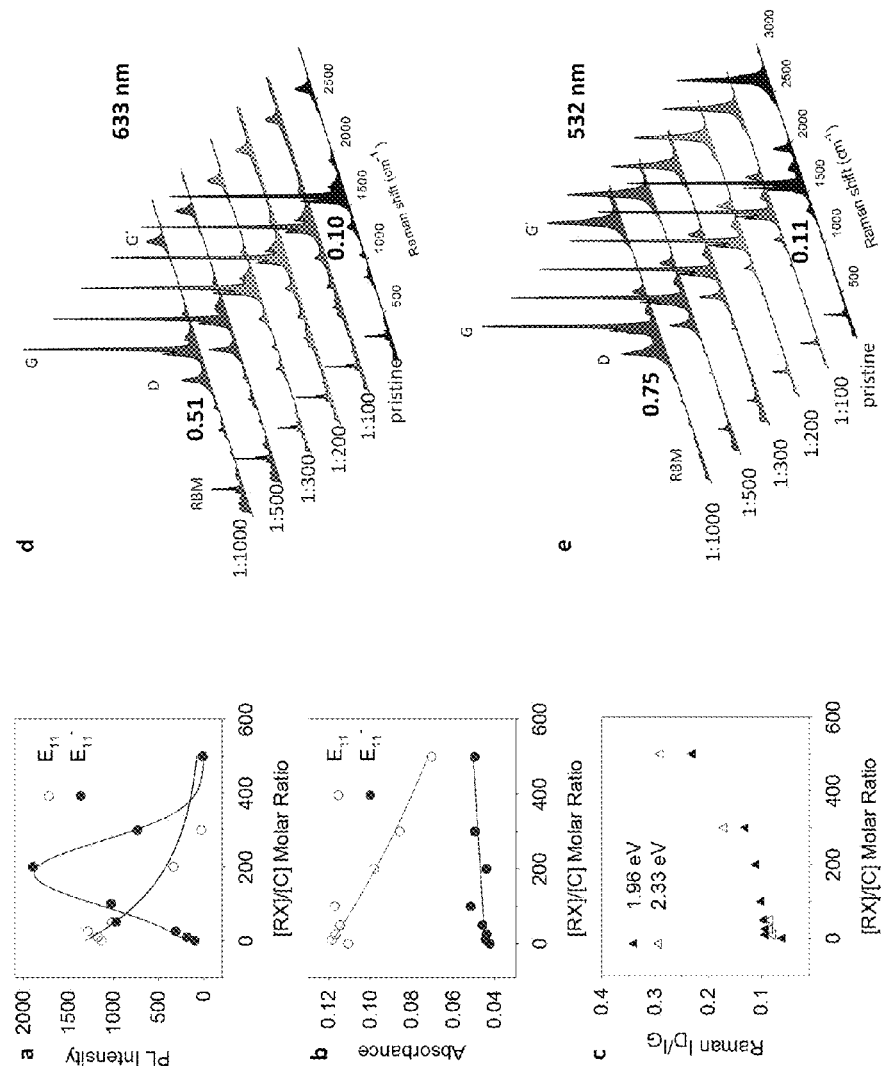

FIG. 12 illustrates the correlated spectral characterization of functionalized CoMoCAT SWCNTs at an increasing ratio of —CF$_2$(CF$_2$)$_4$CF$_3$ groups. Panel a: PL; Panel b: absorption; and Panel c: Raman D/G ratio as a function of [RX]/[C] molar ratio. Raman spectra with 632.8 nm and 532 nm excitation laser are illustrated in Panel d and Panel e, respectively.

Figure 13:
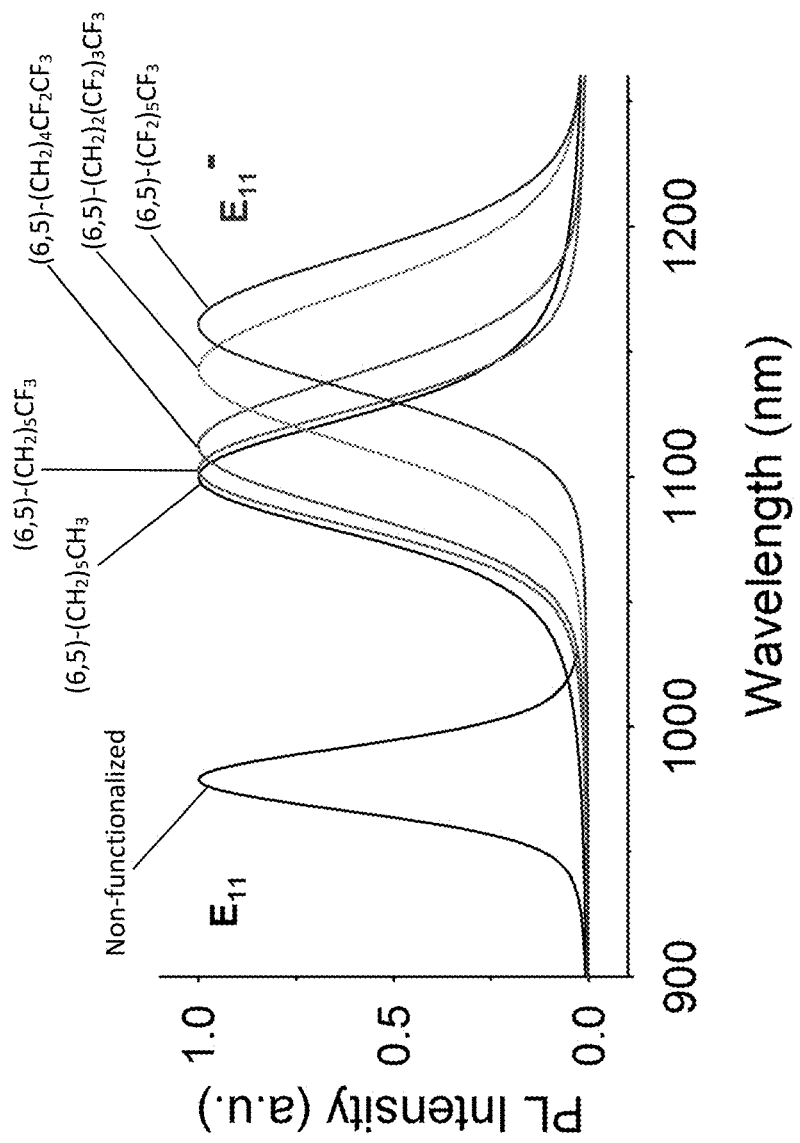

FIG. 13 illustrates tunable near-infrared PL from quantum defect-tailored (6,5)-SWCNTs with six-carbon alkyl chains with an increasing numbers of fluorine substituents.

Figure 14:
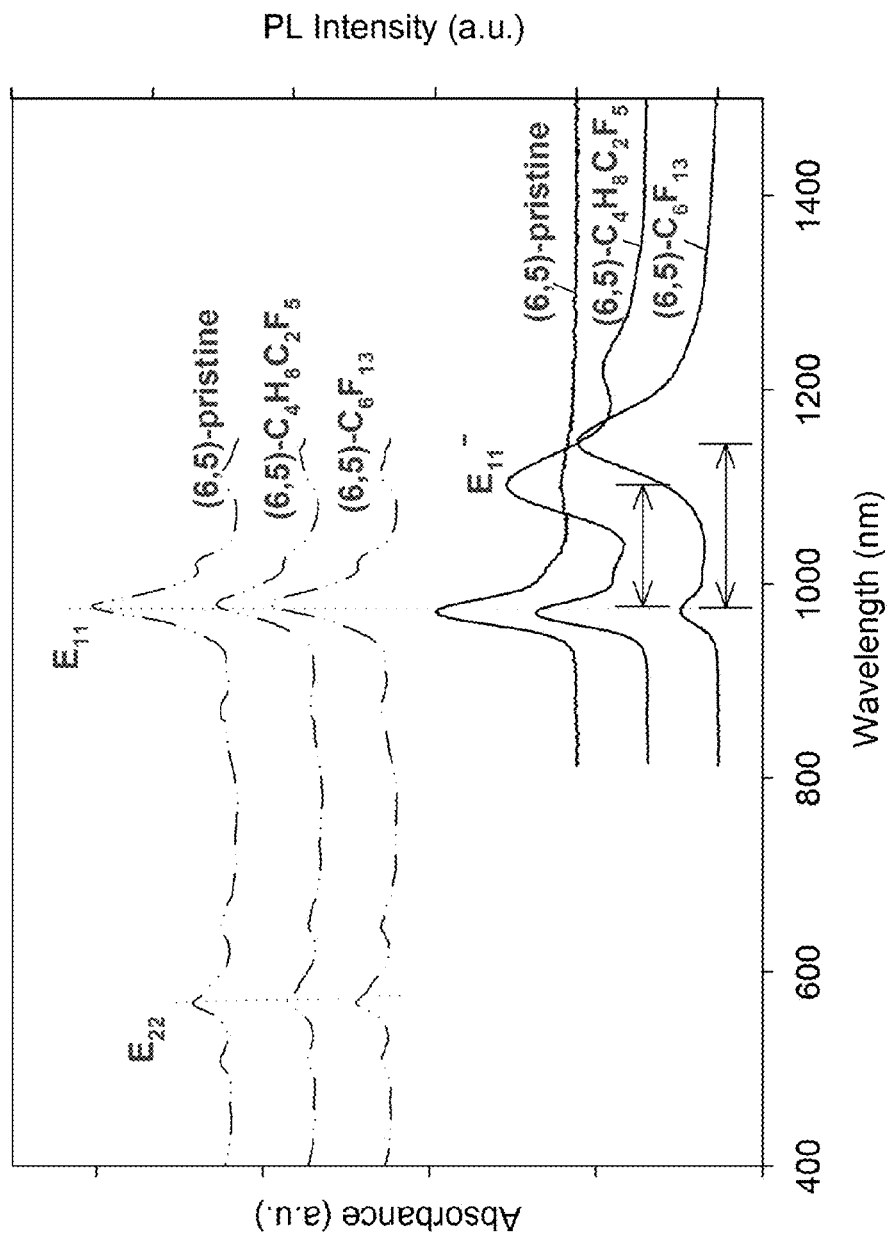

FIG. 14 illustrates correlated UV-Vis-NIR absorption and PL of (6,5)-SWCNTs with different functional groups.

Figure 15:
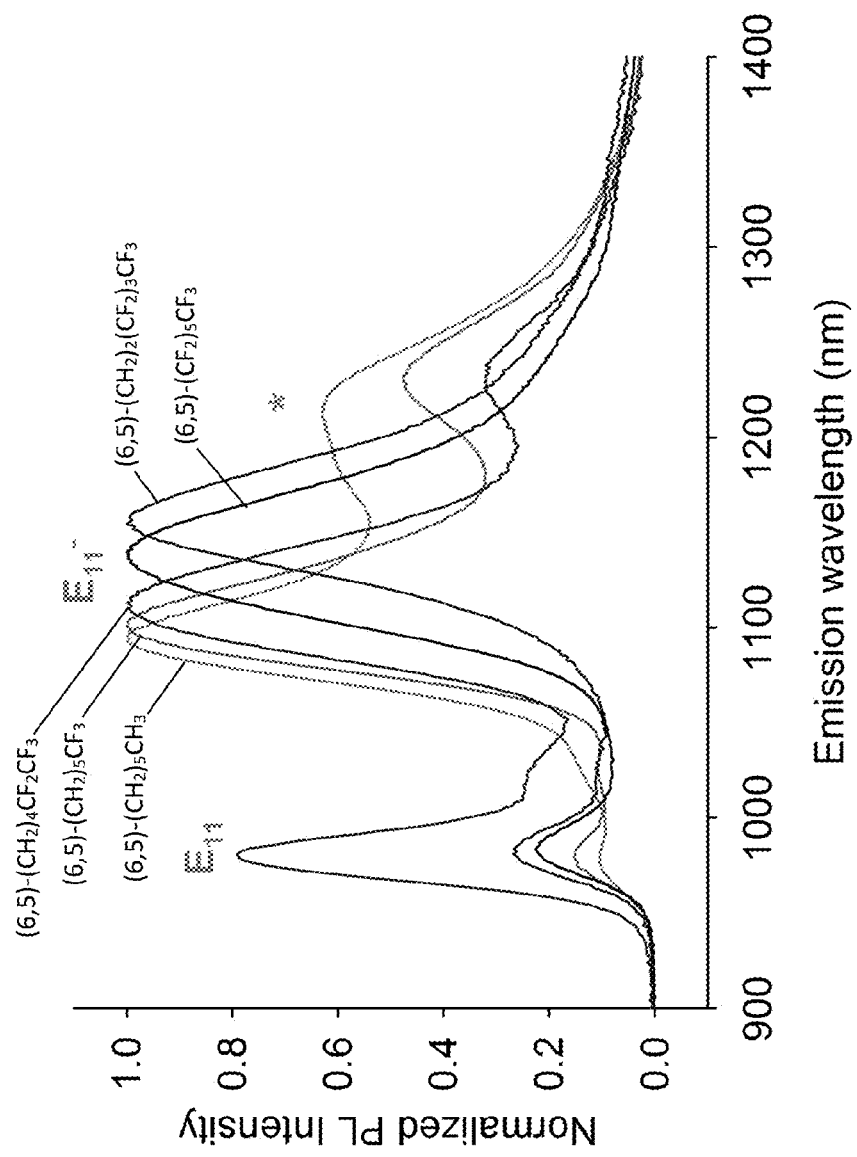

FIG. 15 illustrates the emission spectra of (6,5)-SWCNTs with six carbon alkyl chains before peakfitting. Additional satellite peaks were observed and marked with asterisk (*) arising from a charged exciton (trion).

Figure 16:
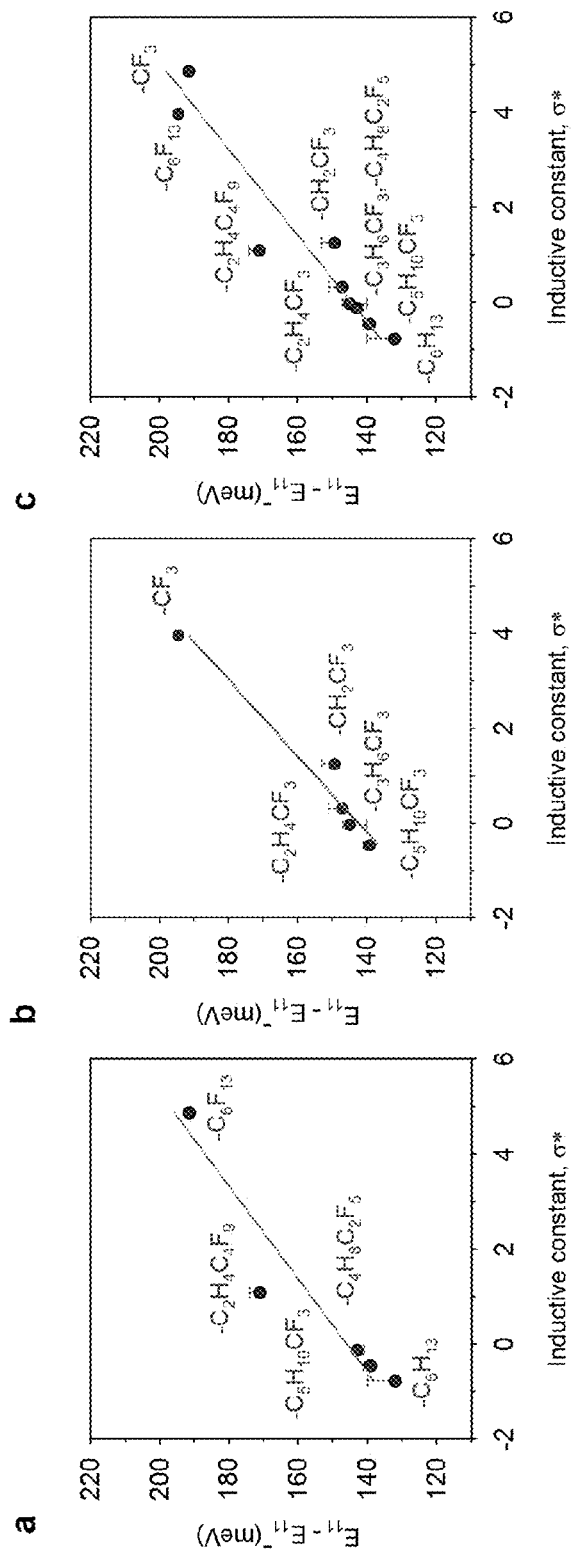

FIG. 16 illustrates the linear correlation between energy shift and calculated inductive constant of non-, partially-, and per-fluorinated alkyl groups. Panel a: Fluorination effects in hexyl functionalized (6,5)-SWCNTs; Panel b: Effects of chain length in (6,5)-SWCNT-(CH$_2$)$_n$CF$_3$; Panel c: Summary of inductive effects in the energy shifts.

Figure 17:
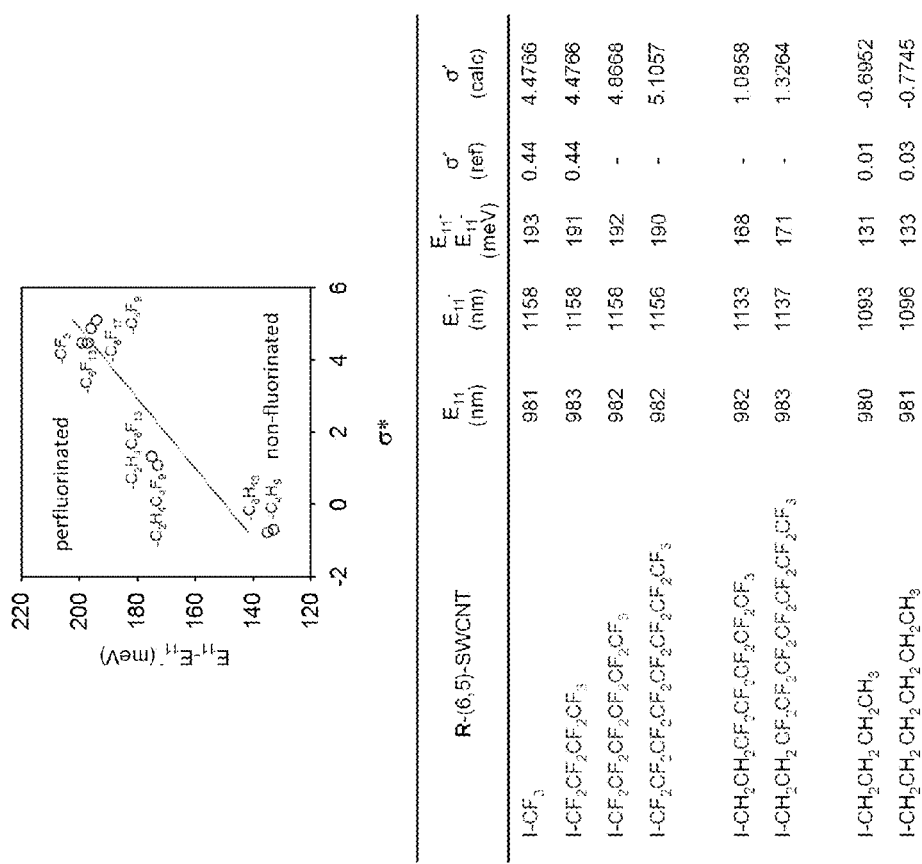

FIG. 17 illustrates the energy shift versus calculated inductive constant with non-, partially-, and per-fluorinated alkyl groups and tabulates their emission wavelength and energy shifts.

Figure 18:
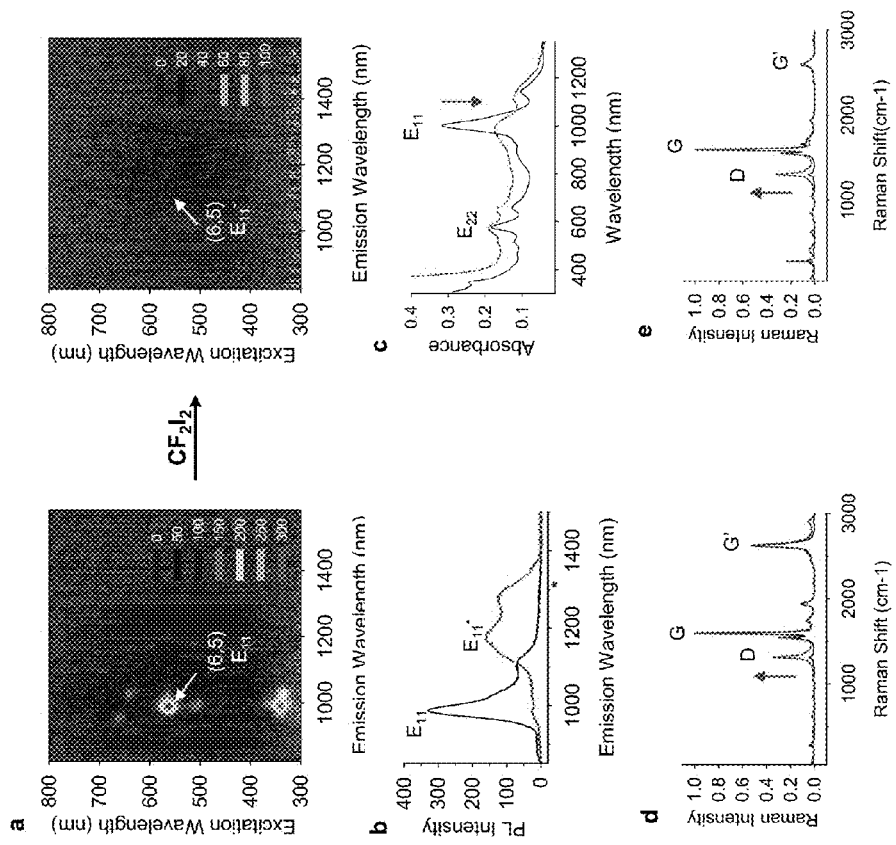

FIG. 18 illustrates (6,5)-SWCNT>CF$_2$. Panel a: PL maps of pristine SWCNTs (left) and divalent alkyl-functionalized SWCNTs (right); Panel b: 565 nm excitation emission spectra; Panel c: UV-Vis-NIR Absorption spectra; Panel d: Raman spectra with 532 nm laser; and Panel e: Raman spectra with 632.8 nm laser. The pristine is black solid and the functionalized SWCNTs are red solid line.

Figure 19:
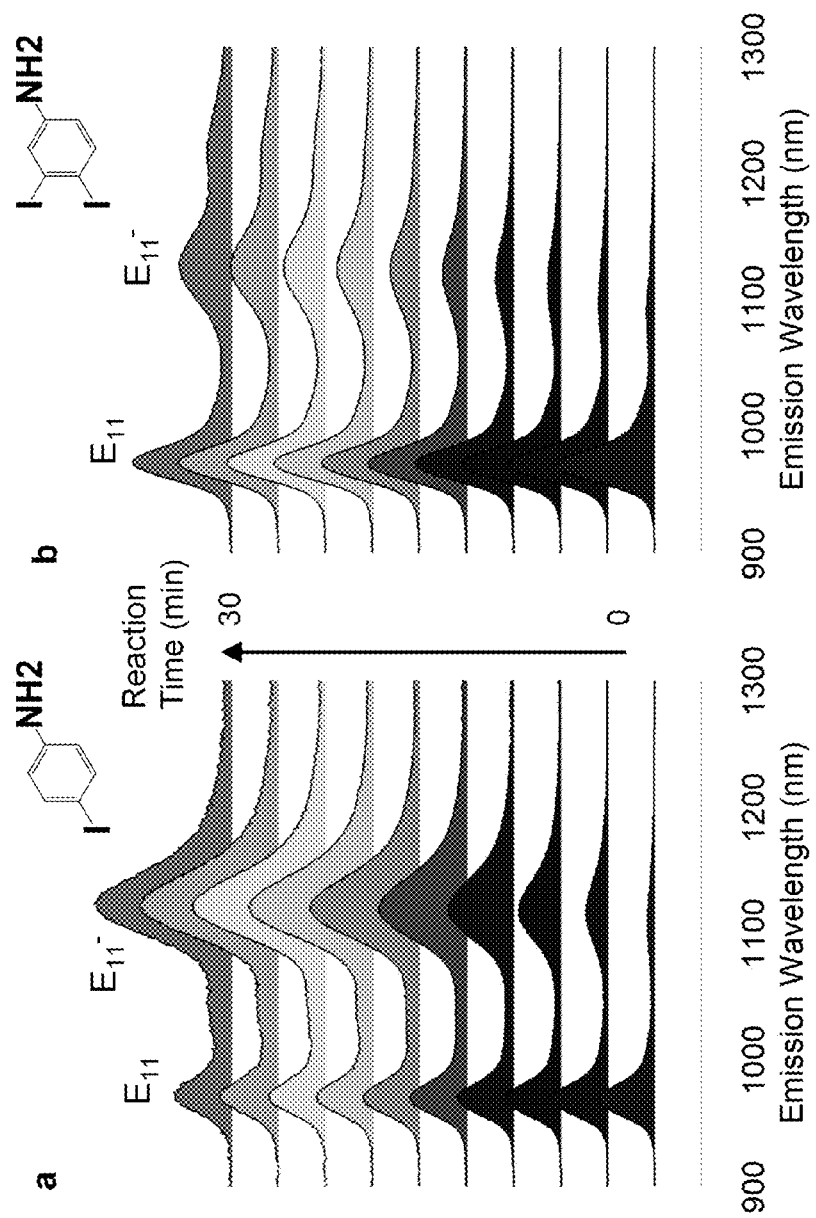

FIG. 19 illustrates the creation of monovalent (Panel a) and divalent (Panel b) aryl defects of aminobenzene-(6,5)-SWCNTs. The aryl defect was created by excitation light (300-1200 nm) without sodium dithionite. Single emission spectra are obtained with 565 nm excitation light and normalized by E$_{11}$.

Figure 20:
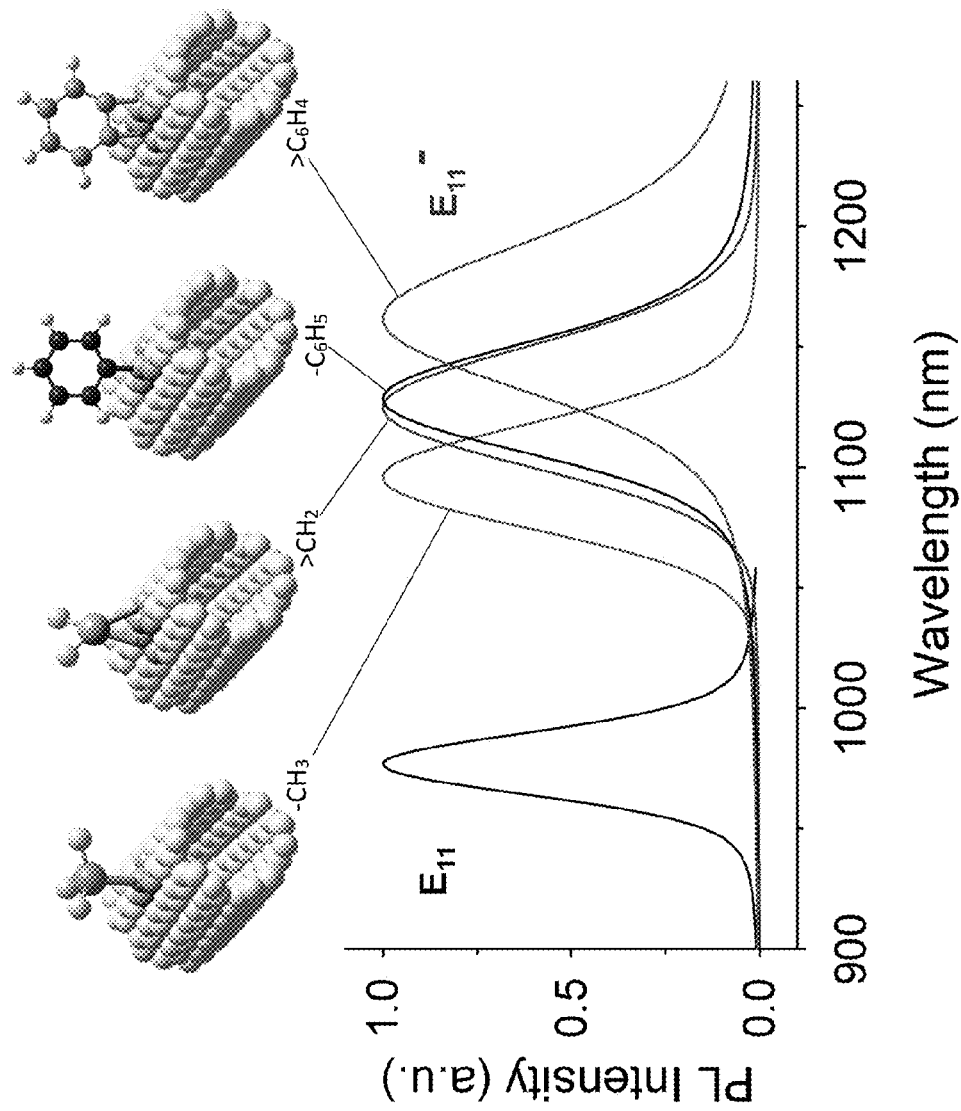

FIG. 20 illustrates a comparison of monovalent and divalent fluorescent quantum defects. The nanotubes were excited at 565 nm. The parent exciton PL occurs at 979 nm while emission from the quantum defects are systematically tunable by changing the functional group including —CH$_3$, > CH$_2$, —C$_6$H$_5$, and >C$_6$H$_4$. The spectra are fitted with Voigt functions.

Figure 21:
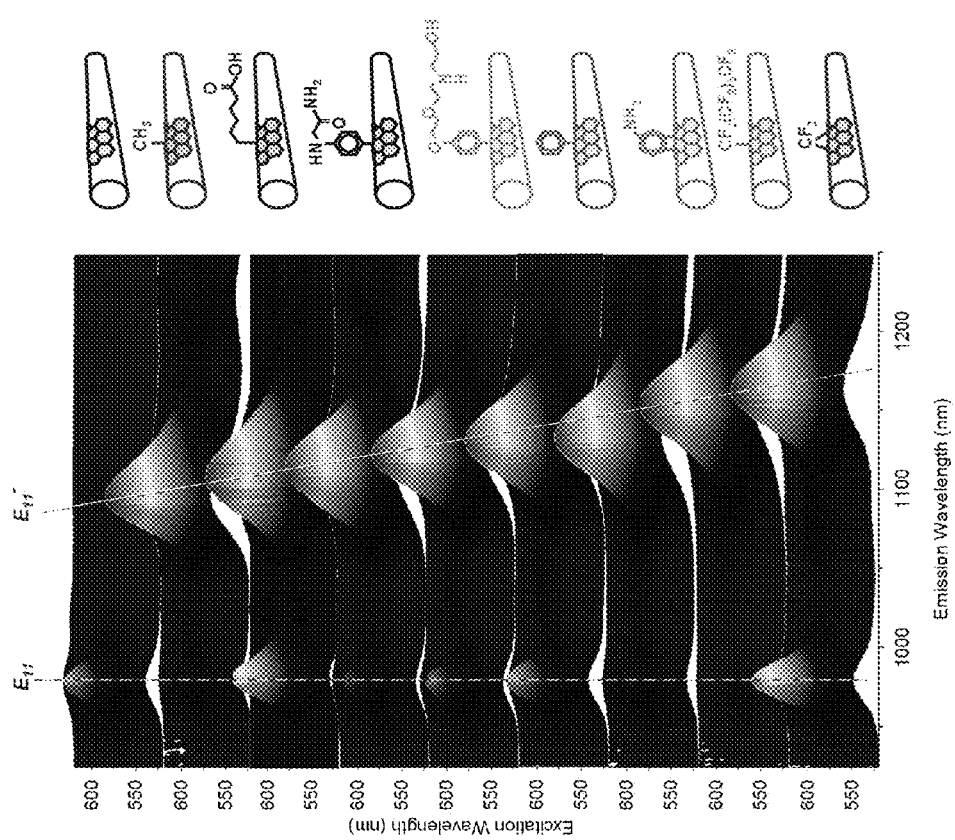

FIG. 21 illustrates excitation-emission maps of (6,5)-SWCNTs with chemically tailored fluorescent quantum defects.

Figure 22:
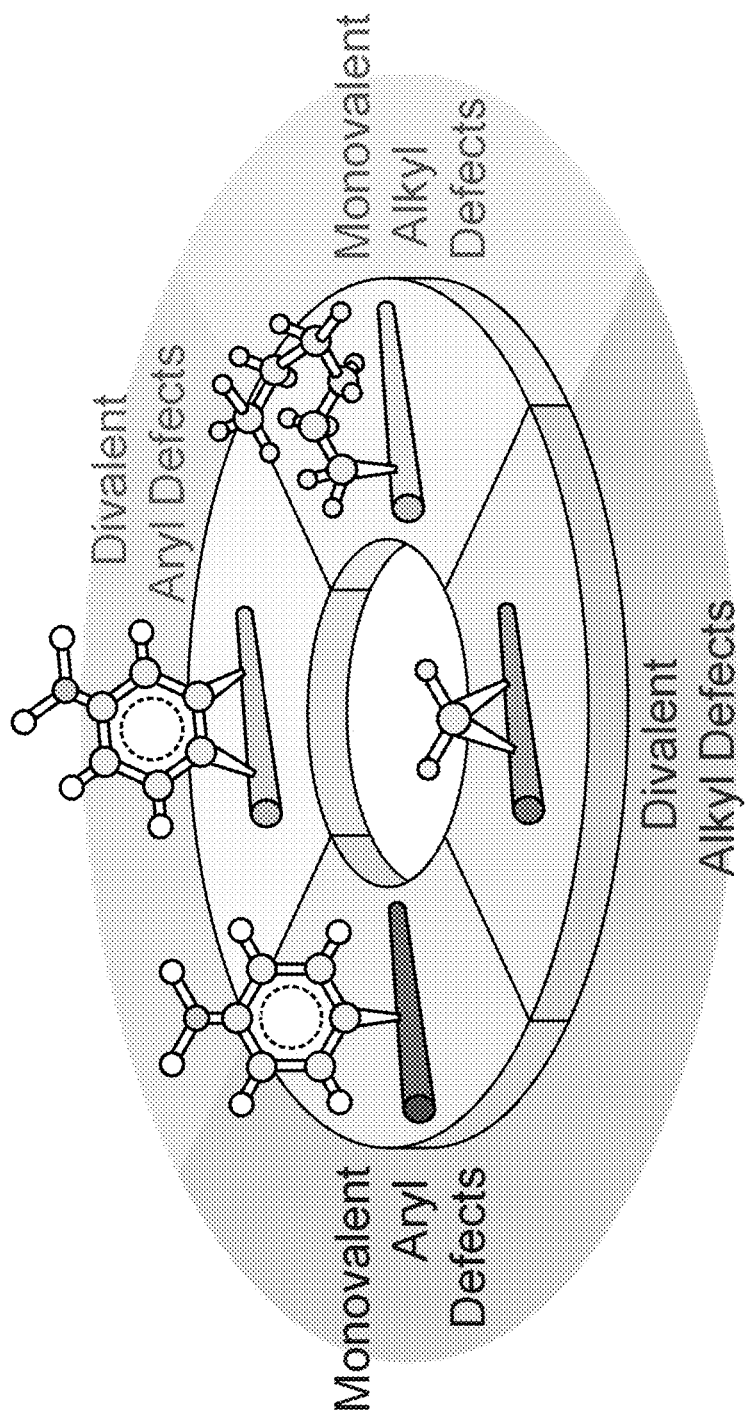

FIG. 22 illustrates schematically four classes of quantum defects.

Figure 23:
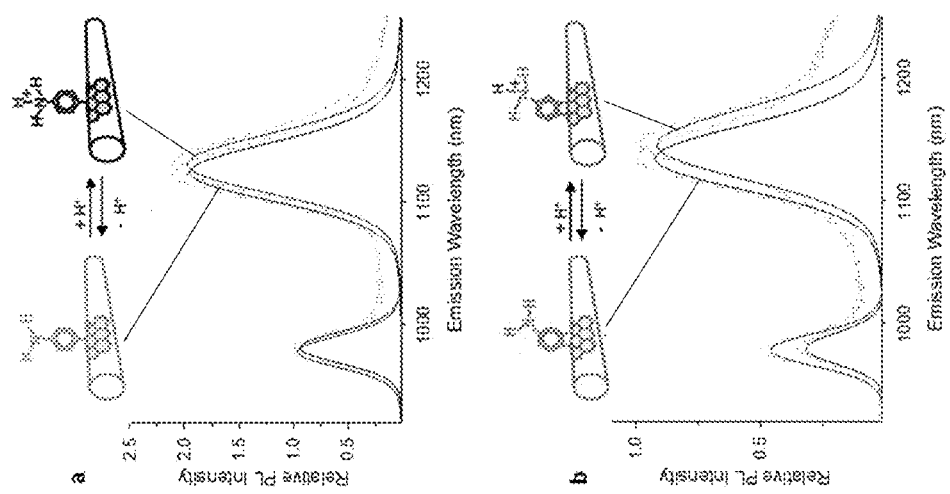

FIG. 23 illustrates pH-responsive defect photoluminescence of monovalent (Panel a) and divalent (Panel b) aminobenzene-functionalized (6,5)-SWCNTs.

DETAILED DESCRIPTION OF EMBODIMENTS OF THE INVENTION

Figure 1:
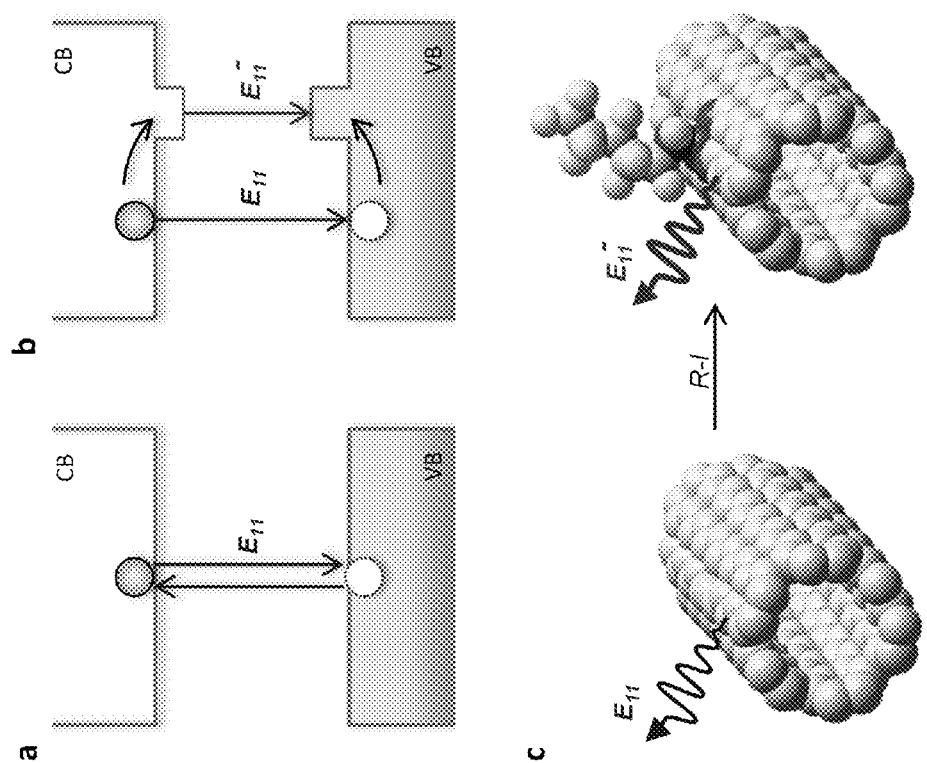
FIG. 1 illustrates a fluorescent quantum defect approach to material engineering as compared to a quantum confinement approach. Panel a illustrates a quantum confinement system, wherein the exciton wavefunction is confined as the particle size reaches the Bohr radius of the quasi-particle, lending the capability to control optical properties by size engineering. Panel b illustrates a quantum defect system in accordance with the present invention, wherein the mobile excitons are trapped and their optical properties controlled by molecular engineering of the trap. Panel c illustrates the creation of a fluorescent quantum defect by reacting a SWCNT semiconductor with an exemplary alkyl iodide (R-I).

The present invention relates to a new series of near-infrared emitters and a versatile new synthetic approach for creating near-infrared emitters from a single carbon nanostructure material, e.g., SWCNT, through molecular engineering of covalently attached surface functional groups (FIG. 1). Utilizing the disclosed methodologies, the synthesis of more than thirty new exemplary fluorescent nanostructures was achieved from SWCNTs of the same crystal structure by creating molecularly tunable fluorescent quantum defects in the sp$^3$ carbon lattice. Each of the new synthetic nanostructures may be viewed as a diamond-in-graphene structure reminiscent of an island in an electron sea.

As used herein, the term "carbon nanostructure" refers to allotropic forms of carbon, with or without impurities, in the form of a single-walled or multi-walled tube, cylinder, sphere, crystal, sheet, rod, or other structure. In some embodiments, the carbon nanostructure is a carbon nanotube (CNT) having a generally cylindrical nanostructure. CNTs may be differentiated according to their chirality, diameter, wall number, and/or electrical properties. In some implementations, the CNT is a single-walled CNT (SWCNT). In other implementations, the CNT is a multi- or double-walled CNT (e.g., DWCNT). In some implementations, the CNT is a small diameter CNT (e.g., having a diameter of less than about 1 nm, or less than about 0.5 nm). In other implementations, that CNT is a large diameter CNT (e.g., having a diameter of more than about 1 nm, or more than about 2.0 nm). In some implementations, the CNT has a diameter of between about 0.5 nm and about 1.6 nm. A "covalently functionalized CNT" refers to a CNT having a surface functional group(s) attached to the carbon sidewall or lattice via a covalent bond.

The term "pristine carbon nanostructure" refers to a carbon nanostructure, e.g., a CNT, that has no observable surface modifications (except, e.g., at the nanotube ends of a CNT, as determined by Raman spectroscopy or other methods known in the art).

The term "substantially pure CNT" as used herein refers to a CNT or covalently functionalized CNT comprising more than about 80% of one type, and/or chirality and less than about 20% of other types and/or chiralities as established using conventional analytical methods, e.g., UV-vis-Near Infrared Spectroscopy, routinely used by those of skill in the art. In one embodiment, the amount of other types and/or chiralities in a substantially pure CNT or covalently functionalized CNT is less than about 20%, less than about 10%, less than about 5%, less than about 2%, less than about 1%, or less than about 0.5%.

The term "defect" as used herein refers to an irregularity in the bonding network or lattice of a carbon nanostructure. In some embodiments, the defect is a $sp^3$ defect.

The term "alkylating agent" as used herein refers to reagent capable of placing an alkyl group onto a nucleophilic site, including, but not limited to, organic halides.

In the case of semiconducting nanotubes with fluorescent defects, such structures can be viewed as hybrid quantum systems that allow excitation energy (carried by the exciton) to be channeled along a one-dimensional (1D) antenna and then harvested using a zero-dimensional (0D) funnel. Compared with quantum confinement, which controls the optical and electronic gap by size engineering, the fluorescent defects in SWCNTs create local potential wells that can be chemically tailored with superior molecular-control as shown herein. To recognize their molecular nature and the fact that the local potential well is a result of defect-induced splitting of frontier orbitals, the defects may be referred to herein as fluorescent quantum defects. Furthermore, unlike atomic color-center dopants, the defect-inducing surface functional groups are themselves non-emitting and readily accessible chemically, thereby affording unprecedented molecular control and engineering flexibility as compared to prior methodologies.

In accordance with disclosed embodiments, the molecularly tunable fluorescent quantum defects are achieved by a versatile new chemistry that allows covalent attachment of bromine or iodine-containing hydrocarbon precursors to the $sp^2$ carbon lattice through highly predictable C—C bonding. The reaction occurs in aqueous solution upon mixing an alkyl halide with nanotubes in the presence of sodium dithionite (Na2S2O4) which acts as a mild reductant (see Zhang, C.-P. et al. (2012) "*Progress in fluoroalkylation of organic compounds via sulfinatodehalogenation initiation system,*" Chem. Soc. Rev. 41:4536-4559). We note that sidewall alkylation can occur under extreme conditions, such as in the Billups-Birch reaction in which solvated electrons in liquid ammonia are required (Liang, F. et al. (2004) "*Convenient Route to Functionalized Carbon Nanotubes,*" Nano Lett. 4:1257-1260; Deng, S. et al. (2011) "*Confined propagation of covalent chemical reactions on single-walled carbon nanotubes,*" Nat. Commun. 2). In contrast, the disclosed methodologies are significantly more versatile because molecularly tunable fluorescent quantum defects can be created with highly predictable C—C bonding points from virtually any iodine-containing hydrocarbon precursor. Notably, this exciton-tailoring chemistry is not limited to the creation of monovalent alkyl defects. Rather, both monovalent and divalent defects can be created by reacting SWCNTs with respective iodide or di-iodide alkyl or aryl precursors. In contrast to alkyl iodides, which provide for activation by sodium dithionite, aryl iodides alone can react with SWCNTs by resonantly exciting the nanotubes with visible light. Furthermore, the aqueous medium allows for in situ probing of the evolution of sidewall alkylation and provides a level of control that was previously unattainable (Ghosh, S. et al. (2010) "*Oxygen doping modifies near-infrared band gaps in fluorescent single-walled carbon nanotubes,*" Science 330:1656-1659; Piao, Y. M. et al. (2013) "*Brightening of carbon nanotube photoluminescence through the incorporation of sp3 defects,*" Nat. Chem. 5:840-845).

Figure 3:
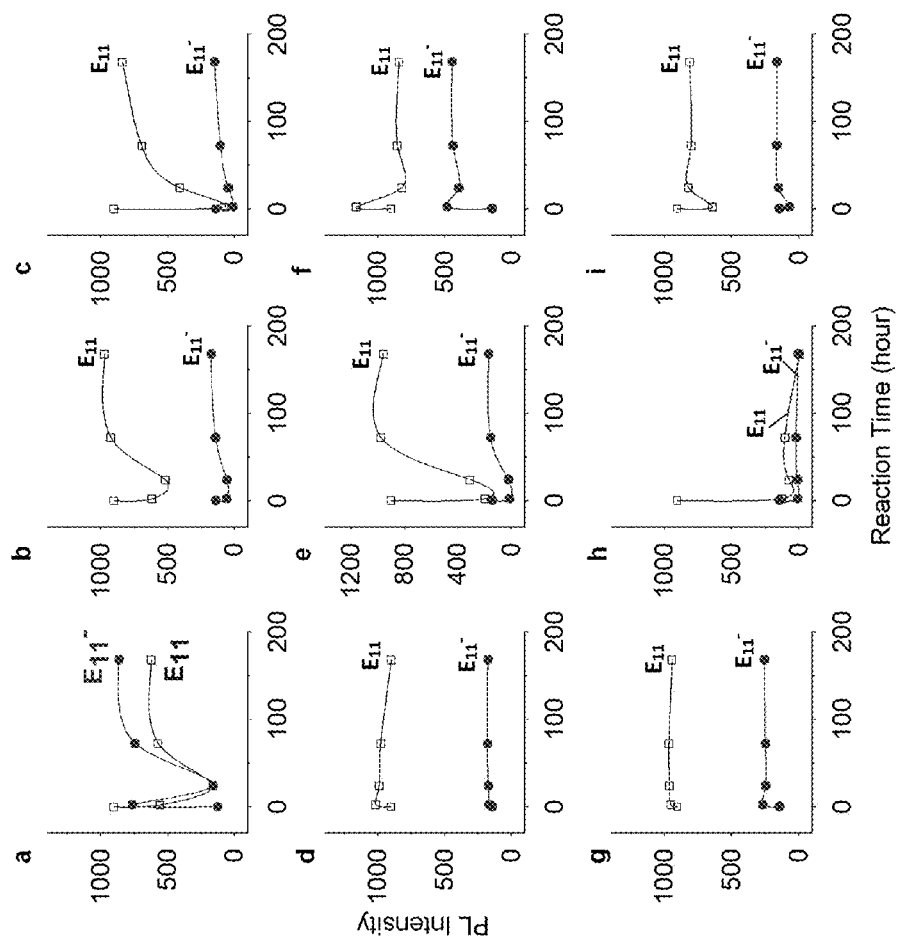
FIG. 3 illustrates graphically control reactions with different reagent conditions (set forth in Table 1). Emission spectra are monitored with 565 nm excitation at 0 h, 2 h, 24 h, 3 days and 7 days. Only the reaction condition shown in Panel a exhibits the strong defect PL ($E_{11}^-$).

In accordance with one embodiment, a new exciton-tailoring reaction is provided, which occurs in aqueous solution upon mixing an alkyl halide with nanotubes in the presence of the mild reductant sodium dithionite (FIG. 3 and Table 1). Alkyl halides alone cannot generate alkyl radicals that covalently attach to the carbon lattice (FIG. 3, Panel c and Panel i). Control experiments indicated that the reaction is facilitated by acetonitrile, which acts as a co-solvent for the alkyl halides, not required to generate defect photoluminescence (FIG. 3, Panel b and Panel f). Sodium bicarbonate serves as a base to balance acidic byproducts of sodium dithionite (FIG. 3, Panel d and Panel h) as explained with organic small molecules (Zhang, C.-P. et al. (2012) "*Progress in fluoroalkylation of organic compounds via sulfinatodehalogenation initiation system,*" Chem. Soc. Rev. 41:4536-4559; Xiao, Z. et al. (2013) "*Radical Addition of Perfluoroalkyl Iodides to Alkenes and Alkynes Initiated by Sodium Dithionite in an Aqueous Solution in the Presence of a Novel Fluorosurfactant,*" Chin. J. Chem. 31:939-944).

TABLE 1

Control reactions with different reagent conditions

| Reaction | SWCNT | CH$_3$CN | C$_8$F$_{13}$I | NaHCO$_3$ | Na$_2$S$_2$O$_4$ | E$_{11}^-$ |
|---|---|---|---|---|---|---|
| a | 1 | 0.2 | 10 | 20 | 10 | strong |
| b | 1 | 0.2 | — | — | — | — |
| c | 1 | — | 10 | — | — | — |
| d | 1 | — | — | 20 | — | — |
| e | 1 | — | — | — | 10 | — |
| f | 1 | — | 10 | 20 | 10 | weak |
| g | 1 | 0.2 | — | 20 | 10 | — |
| h | 1 | 0.2 | 10 | — | 10 | — |
| i | 1 | 0.2 | 10 | 20 | — | — |

Figure 4:
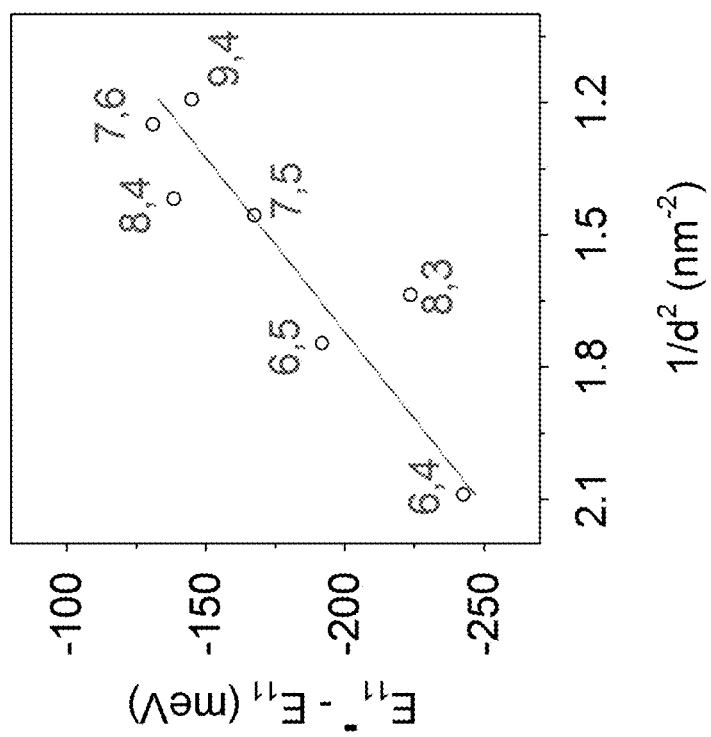
FIG. 4 illustrates graphically that emission energy of defect photoluminescence is dependent on nanotube diameter. Chirality enriched carbon nanotubes were used and functionalized with —$CF_2(CF_2)_4CF_3$ groups.

The emission energy of the alkylated carbon nanotubes showed a strong dependence on nanotube diameter, d, by $\Delta E = A/d^2 + B$ with $A = -126.8$ meV nm$^2$ and $B = 18.1$ meV, suggesting that the new emission peak arises from brightening of dark excitons (FIGS. 4 and 5) (Piao, Y. et al. (2013) "*Brightening of carbon nanotube photoluminescence through the incorporation of sp3 defects,*" Nat. Chem. 5:840-845; Capaz, R. B. et al. (2006) "*Diameter and chirality dependence of exciton properties in carbon nanotubes,*" Phys. Rev. B 74, 121401). Notably, the (6,5)-SWCNT-CF$_2$(CF$_2$)$_4$CF$_3$ exhibits PL that is brighter than that of the parent nanotube by more than an order of magnitude (FIG. 6).

Correlated measurement of PL, Raman scattering, and X-ray photoelectron spectroscopy (XPS) unambiguously confirmed that the new PL originates from $sp^3$ quantum defects due to the covalent attachment of a small number of the alkyl groups to the $sp^2$ carbon lattice (FIG. 7). The formation of a covalent C—C bond between the alkyl group and the carbon nanotube is evidenced by the rise of the symmetry-breaking, defect-induced Raman scattering of the D phonon (~1,300 $cm^{-1}$) (Dresselhaus, M. S. et al. (2007) "Raman Spectroscopy of Carbon Nanotubes in 1997 and 2007," J. Phys. Chem. C 111:17887-17893). The intensity of this Raman band with respect to the in-plane stretching mode ($E_{2g}$) of the $sp^2$ bonded carbon lattice (G band, ~1590 $cm^{-1}$) increased from 0.10 to 0.98 in highly functionalized nanotubes (FIG. 7, Panel a). Both the Raman D/G ratio and the XPS intensity of the perfluoroalkyl group increased in proportion to the relative concentration of alkyl halide (FIG. 7, Panels a and b, and FIG. 9). High resolution XPS of SWCNT-$CF_2(CF_2)_4CF_3$ shows the growth of the $sp^3$ C1s peak at 285 eV as a shoulder to the $sp^2$ C1s peak (284.7 eV), resulting in substantial peak broadening of the C1s peak (FWHM of 1.46 eV versus 0.83 eV for the starting nanotubes) (FIG. 8). The fluorine (F1s) signal of the functional group remained constant at high temperature (e.g., 175° C.) in ultrahigh vacuum (<1×10 torr), in which there are no physisorbed molecules (FIG. 10).

The new defect PL was further investigated with different SWCNT samples such as HiPco ensemble, CoMoCAT ensemble, the aqueous two phase-assisted SWCNTs (Ao, G. et al. (2014) "DNA-Controlled Partition of Carbon Nanotubes in Polymer Aqueous Two-Phase Systems," J. Am. Chem. Soc. 136:10383-10392) and the column-purified SWCNTs to rule out the possibility of impurity effects (see FIG. 11). FIG. 11 illustrates the spectroscopic characterization of (6,5)-SWCNT-$CH_2(CH_2)_4CH_3$ stabilized in 1 wt./v % SDS-$D_2O$. Defect PL from the chemically tailored (6,5)-SWCNT can be clearly identified in the same emission energy regardless of the source of raw nanotube materials: two phase separation isolated CoMoCAT SG65i (FIG. 11, Panels a, d and g), gel purified HiPco (FIG. 11, Panels b, e, and h), and unpurified CoMoCAT SG65i (FIG. 11, Panels c, f and i). FIG. 11, Panels a, b and c: The excitation-emission PL map. FIG. 11, Panels d, e and f: 565nm single excitation PL spectra ($E_{11}$ and $E_{11}^-$ PL positions marked). FIG. 11, Panels g, h and i: UV-vis-NIR absorption spectra. These results demonstrate the defect PL is unique with new properties incorporated through the chemical modification. All showed the consistent ΔE of defect PL for the (6,5) chirality tubes for all tested samples. Furthermore, the correlated emission, absorption and Raman with (6,5)-CoMoCAT-$CF_2(CF_2)_4CF_3$ showed identical results of close relationship between covalent attachment and defect PL brightening (FIG. 12).

Figure 2:
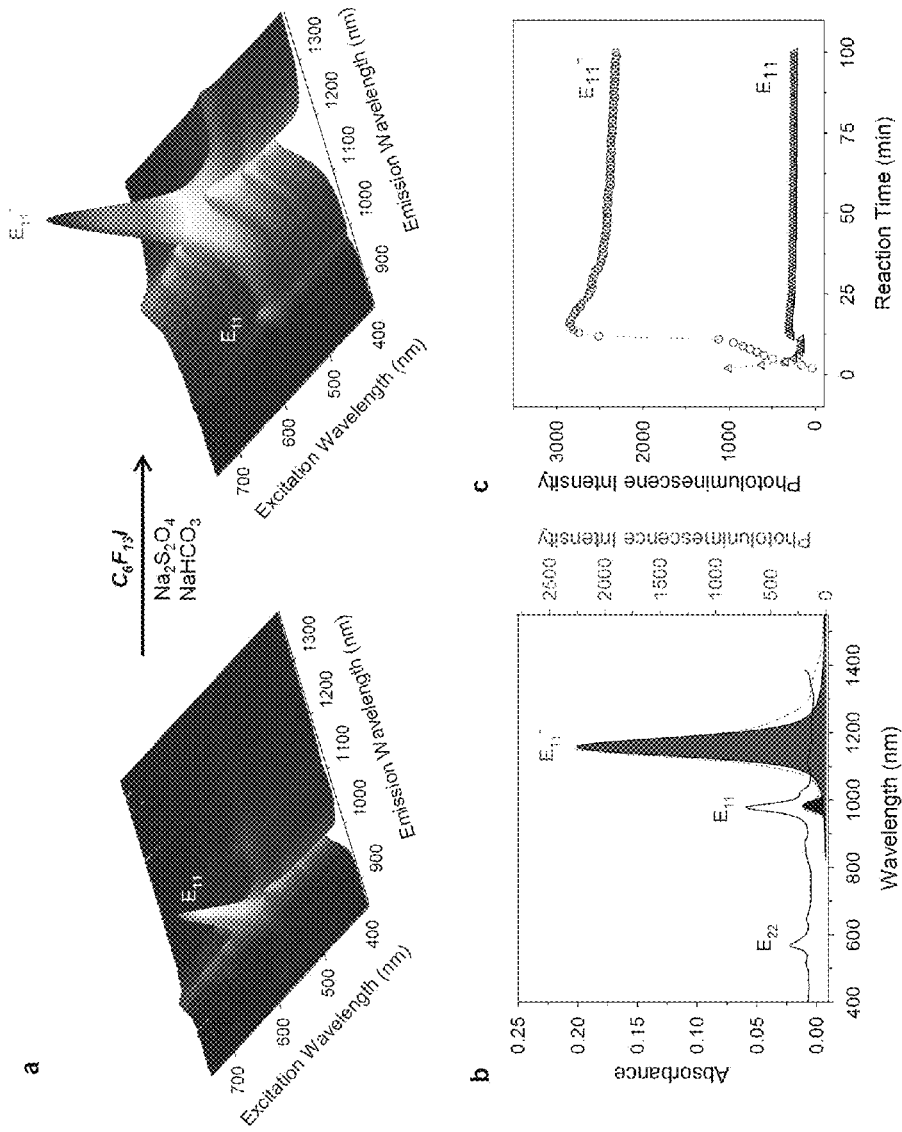
FIG. 2 illustrates graphically the chemical creation of fluorescent (6,5)-SWCNT-$CF_2(CF_2)_4CF_3$. As shown in Panel a, defect photoluminescence arises farther in the near-infrared, 190 meV to the red of the parent nanotube excitonic emission. Correlated visible near-infrared absorption (black line) and PL (red line) spectra for (6,5)-SWCNT-$CF_2(CF_2)_4CF_3$ are illustrated graphically in Panel b, wherein the SWCNTs are excited at the $E_{22}$ transition (565 nm). Evolution of $E_{11}$ and $E_{11}^-$ emission is illustrated graphically in Panel c.

By changing the concentrations of the reagents, the intensity of the defect PL was controlled. The $E_{11}^-$ intensity of (6,5)-SWCNT-$CF_2(CF_2)_4CF_3$ peaks at a carbon-to-alkyl halide reactant molar ratio of 1 to 0.4 (FIG. 2). Correspondingly, the Raman D/G ratio increased from 0.10 to 0.18, indicating that a small amount of alkyl groups were covalently attached on the nanotubes. Consistent with Raman scattering, the visible near-infrared absorption barely decreased. Based on XPS (FIGS. 2 and 7), the attached —$CF_2(CF_2)_4CF_3$ groups were estimated to be at a density of one group per 166 carbons or 1.8 nm of nanotube length on average. This density is much higher than that produced by diazonium salts (see Piao, Y. et al. (2013) "Brightening of carbon nanotube photoluminescence through the incorporation of sp3 defects," Nat. Chem. 5:840-845) and may suggest distinct reaction propagation (Zhang, Y. et al. (2013) "Propagative Sidewall Alkylcarboxylation that Induces Red-Shifted Near-IR Photoluminescence in Single-Walled Carbon Nanotubes," J. Phys. Chem. Lett. 4:826-830).

Tunable Fluorescent Quantum Defects with Alkylation

The disclosed synthetic quantum systems provide exceptional chemical tunability of the near-infrared PL energy (FIGS. 13 and 15). Continuous red-shift of the $E_{11}^-$ emission was achieved simply by increasing the number of fluorine atoms along a six-carbon alkyl backbone (FIG. 13 Panel b, and FIG. 16 Panel a, and Table 2). The energy shift moved from 133 meV for —$CH_2(CH_2)_4CH_3$ to 190 meV for —$CF_2(CF_2)_4CF_3$. A consistent trend was observed in a series of partially fluorinated groups in which the distance between the electron withdrawing moiety (—$CF_3$) and the defect site was varied by the chain length, —$(CH_2)_nCF_3$ (n=0-5), (see FIG. 16 Panel b, and Table 2), resulting in the energy shift from 137 meV to 194 meV. When the first carbon of alkyl chains that is directly attached to a SWCNT was fluorinated, it significantly affected the energy separation, indicating strong distance effect.

TABLE 2

Spectral characteristics of alkyl fluorescent quantum defects in (6,5)-SWCNTs and calculated inductive constants of the covalently bonded alkyl groups.

| (6,5)-SWCNT-R | $E_{11}$ (nm) | $E_{11}$ FWHM (meV) | $E_{11}^-$ (nm) | $E_{11}^-$ FWHM (mev) | ΔE (meV) | σ* (calc) |
|---|---|---|---|---|---|---|
| Non-functionalized | 979 | 37 | — | — | 0 | — |
| —$CH_2CH_2CH_2CH_2CH_2CH_3$ | 981 | 45 | 1096 | 56 | 133 | −0.774 |
| —$CH_2CH_2CH_2CH_2CH_2CF_3$ | 980 | 45 | 1099 | 56 | 137 | −0.462 |
| —$CH_2CH_2CH_2CH_2CF_2CF_3$ | 980 | 38 | 1107 | 59 | 146 | −0.127 |
| —$CH_2CH_2CF_2CF_2CF_2CF_3$ | 983 | 40 | 1137 | 76 | 170 | 1.086 |
| —$CF_2CF_2CF_2CF_2CF_2CF_3$ | 981 | 42 | 1155 | 69 | 190 | 4.867 |
| —$CH_2CH_2CH_2CH_2CH_2CF_3$ | 980 | 45 | 1099 | 56 | 137 | −0.462 |
| —$CH_2CH_2CH_2CH_2CF_3$ | 979 | 40 | 1104 | 59 | 143 | −0.287 |
| —$CH_2CH_2CH_2CF_3$ | 980 | 42 | 1101 | 55 | 140 | −0.034 |
| —$CH_2CH_2CF_3$ | 980 | 42 | 1110 | 59 | 147 | 0.310 |
| —$CH_2CF_3$ | 982 | 42 | 1114 | 67 | 150 | 1.244 |
| —$CF_3$ | 980 | 45 | 1158 | 63 | 194 | 3.961 |

The optical properties of tunable fluorescent quantum defects with alkyl groups are strikingly different from those of nanocrystals. The size engineering of nanoparticles result in significant change in band gaps and thus both absorption and emission are size-dependent. However, the disclosed alkylation method on the same size nanotube at low defect density can modulate emissions that are created at defect center while retaining similar absorption characteristics through chemical engineering of the surface (FIG. 14). Using this technique, the absorption of functionalized SWCNTs are comparable with that of pristine SWCNTs while their emissions can be efficiently tuned by changing functionality.

Inductive Effects of Alkyl Defects

Experimental results and quantum chemical theory consistently indicated that this tunability originates from inductive electronic effects associated with the covalently attached functional group (FIG. 16). These inductive electronic effects can be described by the empirical Taft constant or inductive constant (G*), which quantifies the electronic influence of a substituent through sigma bonding in alkyl chains, excluding resonance effects that also occur in conjugated moieties (Artem, R. C. et al. (1996) "*The problem of the quantitative evaluation of the inductive effect: correlation analysis*," Russ. Chem. Rev. 65:641; Hansch, C. et al. (1991) "*A survey of Hammett substituent constants and resonance and field parameters*," Chem. Rev. 91:165-195). Consistent with this inductive picture, all perfluorinated alkyl defects in (6,5)-SWCNTs, including —CF$_3$, —(CF$_2$)$_3$CF$_3$, —(CF$_2$)$_5$CF$_3$, and —(CF$_2$)$_7$CF$_3$, produced similarly redshifted $E_{11}^-$ peaks (by 190-194 meV), indicating comparable inductive constants regardless of the carbon chain length (FIG. 17). For CF$_3$-terminated alkyl defects, the defect PL energy decreased exponentially with chain length (or approximately, the distance from the defect site) (Table 2).

Quantitatively, the inductive constants can be calculated from the following equation proposed by Cherkasov et al. (see Artem, R. C. et al. (1996) "*The problem of the quantitative evaluation of the inductive effect: correlation analysis*," Russ. Chem. Rev. 65:641):

$$\sigma^* = 7.840 \Sigma_i \Delta\chi_i R_i^2 / r_i^2$$

where $\Delta_{\chi i}$ is the difference between the electronegativities of i-th atom in the substituent and the reaction center, $R_i$ is the covalent radius of the i-th atom, and $r_i$ is the distance from this atom to the defect site on a SWCNT. The PL energy shifts are linearly correlated with the calculated inductive constants ($\sigma^*_{calc}$) (FIG. 16). This linear correlation confirms that the inductive effects associated with the alkyl groups on the fluorescent quantum defects are responsible for the observed energy shifts. It is noted that more than twenty different types of scales exist for inductive constants reported, which all correlate well with one another. It was found that reported inductive constants from literature for alkyl groups used matched with the calculated results herein.

Creation of Extended Fluorescent Quantum Defects: Aryl and Divalent Defects

The disclosed methodologies of creating fluorescent quantum defects are not limited to creating monovalent alkyl defects (—R), but also extend to divalent alkyl defects (>R) with di-iodide precursors (FIG. 18). The diiodo reactions do not typically occur in organic molecular systems (Zhang, C.-P. et al. (2012) "*Progress in fluoroalkylation of organic compounds via sulfinatodehalogenation initiation system*," Chem. Soc. Rev. 41:4536-4559), while only few conjugated structures with highly substituted π-bonds are reported to yield carbene-like products (Kropp, P. J. (1984) "*Photobehavior of alkyl halides in solution: radical, carbocation, and carbene intermediates*," Acc. Chem. Res. 17:131-137). Divalent alkyl defects are characterized by PL, UV-Vis-NIR absorption and Raman spectra showing distinct different optical properties from monovalent defects including further redshifted defect PL at 1164 nm.

In contrast to alkyl iodides, which provide for activation by sodium dithionite, aryl iodides alone can react with SWCNTs by electromagnetic radiation or excitation light activation (FIG. 19). The wavelength(s) of the electromagnetic radiation is resonant with the SWCNTs for activation. By shining excitation light, e.g., having a wavelength(s) from 300 nm to 1200 nm with 5 nm increment, the wavelength resonant with the SWCNTs, we observed the development of defect photoluminescence with 159 meV energy shift for mono-aminobenzene defect and 171 meV shift for divalent aminobenzene defects starting from with 4-iodoaniline and 3,4-diidoaniline, respectively. It is believed that high π-π interaction between aryl groups and carbon nanotubes leads to physisorption of aryl groups as a first step, followed by creating aryl radicals with incident light to form a covalent bond. Once the first iodide on the benzene ring reacts, there is a high possibility that the second iodide at ortho-positions will interact with SWCNTs, leading to subsequent reactions on an adjacent carbon of the defect center on the rigid SWCNT structures.

Tunable Fluorescent Quantum Defects Through Aryl and Divalent Groups

Larger optical tunability can be achieved by applying diiodo-containing precursors to produce cycloaddition adducts. The divalent quantum defects fluoresce even further into the infrared than do the monovalent defects (FIG. 20). For instance, PL of (6,5)-SWCNT>CH$_2$ occurred at 1125 nm, which was red-shifted by 31 meV more than its monovalent counterpart, (6,5)-SWCNT-CH$_3$. In (6,5)-SWCNT>CF$_2$, the defect PL was further shifted to 1164 nm, 200 meV to the red of the parent nanotube PL. Divalent aryl defects, created by reaction with o-diiodoaniline and o-diiodobenzene for instance, also produced new PL peaks that redshifted farther from the parent nanotube, in comparison with their monovalent counterparts, by 171 meV and 190 meV, respectively (FIG. 20 and Table 3).

TABLE 3

PL spectral characteristics of (6,5)-SWCNTs covalently functionalized with different monovalent and divalent groups.

| | monovalent | | | | | divalent | | |
|---|---|---|---|---|---|---|---|---|
| (6,5)-SWCNT-R | | $E_{11}$ (nm) | $E_{11}^-$ (nm) | ΔE (meV) | (6,5)-SWCNT-R | | $E_{11}$ (nm) | $E_{11}^-$ (nm) | ΔE (meV) |
| —CH$_3$ | 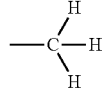 | 980 | 1094 | 132 | >CH$_2$ |  | 980 | 1125 | 163 |

TABLE 3-continued

PL spectral characteristics of (6,5)-SWCNTs covalently functionalized with different monovalent and divalent groups.

| | monovalent | | | | divalent | | |
|---|---|---|---|---|---|---|---|
| (6,5)-SWCNT-R | $E_{11}$ (nm) | $E_{11'}$ (nm) | Δ E (meV) | (6,5)-SWCNT-R | $E_{11}$ (nm) | $E_{11'}$ (nm) | Δ E (meV) |
| —$CF_3$ (—CF₃ structure) | 980 | 1158 | 194 | >$CF_2$ (>CF₂ structure) | 980 | 1164 | 200 |
| —$C_6H_5$ (phenyl) | 979 | 1129 | 168 | >$C_6H_4$ (o-phenylene) | 986 | 1162 | 190 |
| —$C_6H_4NH_2$ (p-aminophenyl) | 980 | 1121 | 159 | >$C_6H_3NH_2$ (aminophenylene) | 980 | 1133 | 171 |

This novel chemistry allows molecularly tunable fluorescent quantum defects to be created with highly predictable C—C bonding points from a halogen-containing hydrocarbon precursor, including monovalent and divalent alkyl defects and monovalent and divalent aryl defects (FIGS. 21 and 22). In preferred embodiments, the halogen-containing hydrocarbon precursor is a chlorine, a bromide, an iodide or a di-halide alkyl precursor. For example, in some implementations, the halogen-containing hydrocarbon precursor is an alkyl halide. In some embodiments, the halogen-containing hydrocarbon precursor is a polymer containing the reactive halogen. For example, in some implementations the halogen-containing hydrocarbon precursor is a polyoligonucleotide containing the reactive halogen.

This highly controllable, tunable property was unattainable with prior techniques, which are limited to specific types of functional groups. Moreover, exciton properties with well-defined divalent defects have not been previously investigated due to issues relating to the reactivity and stability of precursors (see Piao, Y. et al. (2013) "*Brightening of carbon nanotube photoluminescence through the incorporation of sp3 defects*," Nat. Chem. 5:840-845; see also Ghosh, S. et al. (2010) "*Oxygen doping modifies near-infrared band gaps in fluorescent single-walled carbon nanotubes*," Science 330:1656-1659; Zhang, Y. et al. (2013) "*Propagative Sidewall Alkylcarboxylation that Induces Red-Shifted Near-IR Photoluminescence in Single-Walled Carbon Nanotubes*," J. Phys. Chem. Lett. 4:826-830). In FIG. 21, nine exemplary fluorescent quantum defect systems with continuously tunable near-infrared PL and surface functionalities are shown. In some implementations, the sp³ defects were created in a pristine carbon nanostructure during the reacting process. Additional exemplary structures that were synthesized in accordance with disclosed methodologies are listed in Table 4, demonstrating the superior chemical and optical tunability of the disclosed synthetic quantum system.

By trapping excitons at localized potential wells due to the quantum defects, it is believed that the exciton respond sensitively to chemical events occurring at the defect site due to the amplification effects of the nanotube acting as an antenna (FIG. 23). The nanotube antenna harvests light efficiently and channels the generated excitons to the defect site, where the excitons recombine to produce near-infrared PL encoding the chemical information at the functional groups. This conclusion is supported by titration experiments in which H⁺ is detected with both monovalent (6,5)-SWCNT-C6H4NH2, and divalent (6,5)-SWCNT>$C_6H_3NH_2$ defects. We find that, as the amine moiety switches between the protonated and deprotonated states, the defect PL was shifted by ~13 meV. This pH switching was not observed in defects that do not contain amines, including —$C_6H_5$ and >$C_6H_4$, confirming the localized nature and the high chemical selectivity of the fluorescent quantum defects.

The near-infrared emitters synthesized in accordance with the disclosed methodologies include a carbon nanostructure (e.g, SWCNTs) comprising sp³ defects in a carbon lattice thereof (created via reaction with a halogen-containing hydrocarbon precursor), and a functional group covalently bonded to the sp³ defects to produce fluorescent defects that emit near-infrared radiation (e.g., having wavelengths between about 800 nm and about 2500 nm). In accordance with disclosed embodiments, the near-infrared emitters may be functionalized with a monovalent alkyl group, a divalent alkyl group, a monovalent aryl group, or a divalent aryl group. For example, in some embodiments, the functional group is —$(CH_2)_n(CF_2)_mX$, wherein n is an integer between 0 and 17, and wherein m is an integer between 0 and 17, and wherein X is CH3, CF3, NH2, N+(CH2CH3)2, or COOH. In other embodiments, the functional group is —$(CH_2)_nCH_3$, wherein n is an integer between 0 and 10.

TABLE 4

Alkyl/aryl halides used in this study and their defect photoluminescence.

(6,5)-SWCNT —RX or RX₂→ (6,5)-SWCNT-R

| (6,5)-SWCNT-R | $E_{11}$ (nm) | $E_{11^-}$ (nm) | ΔE (meV) | Source of Precursor | —X |
|---|---|---|---|---|---|
| Non-functionalized | 979 | — | — | | |
| —CH₃ | 980 | 1094 | 132 | Sigma Aldrich | I |
| —CH₂CH₂CH₂CH₃ | 984 | 1099 | 132 | Sigma Aldrich | I |
| —CH₂CH₂CH₂CH₂CH₂CH₃ | 981 | 1096 | 133 | Sigma Aldrich | I |
| —CH₂CH₂CH₂CH₂CH₂CH₃ | 980 | 1097 | 135 | Sigma Aldrich | Br |
| —CH₂CH₂CH₂CH₂CH₂CF₃ | 980 | 1099 | 137 | Oakwood chemical | I |
| —CH₂CH₂CH₂CH₂CH₂COOH | 980 | 1102 | 140 | Sigma Aldrich | Br |
| —CH₂CH₂CH₂CF₃ | 981 | 1101 | 140 | Santa Cruz Biotech. | I |
| —CH₂CH₂CH₂CH₂CF₃ | 979 | 1104 | 143 | Aurum Pharmatech LLC. | I |
| —CH₂CF₃ | 981 | 1110 | 147 | Sigma Aldrich | I |
| —CH₂CH₂CH₂CH₂CF₂CF₃ | 980 | 1107 | 146 | Matrix Scientific | I |
| —CH₂CF₃ | 982 | 1114 | 150 | Sigma Aldrich | I |
| —CH₂CF₂CF₂CF₃ | 980 | 1114 | 152 | Pfaltz and bauer | I |
| —C₆H₄—NH₂ | 980 | 1121 | 159 | Sigma Aldrich | I |
| —C₆H₄—N(CH₃)₂ | 984 | 1127 | 160 | AstaTech. Inc. | I |
| —C₆H₄—NHCH₂CH₂C(O)NH₂ | 979 | 1121 | 160 | Enamine LLC | I |
| >CH₂ (¹²C) | 979 | 1125 | 164 | Sigma Aldrich | I₂ |
| >CH₂ (¹³C) | 980 | 1125 | 163 | Cambrige Isotope | I₂ |
| —C₆H₄—O—CH₂CH₂—O—CH₂CH₂—NH—CH₂CH₂—OH | 979 | 1125 | 164 | Hit2lead | I |
| —C₆H₄—H | 979 | 1129 | 168 | Sigma Aldrich | I |
| —C₆H₄—I | 980 | 1131 | 169 | TCI | I |
| —(2,4-dimethyl)C₆H₃—NH₂ | 980 | 1133 | 171 | Spectra Group Limited Inc | I₂ |
| —CH₂CH₂CF₂CF₂CF₂CF₃ | 983 | 1137 | 170 | Sigma Aldrich | I |
| —CH₂CH₂CF₂CF₂CF₂CF₂CF₃ | 983 | 1139 | 173 | Sigma Aldrich | I |
| —CHF₃ | 979 | 1138 | 177 | Sigma Aldrich | I |
| —(3,4-dimethyl)pyridine | 980 | 1145 | 182 | Combiphos catalysts. INC | I |
| —CF₂CF₂CF₂CF₂CF₂CF₂CF₂CF₃ | 979 | 1152 | 190 | Sigma Aldrich | I |
| —(2,4-dimethyl)C₆H₃—H | 986 | 1162 | 190 | Sigma Aldrich | I₂ |

TABLE 4-continued

Alkyl/aryl halides used in this study and their defect photoluminescence.

(6,5)-SWCNT $\xrightarrow{RX\ or\ RX_2}$ (6,5)-SWCNT-R

| (6,5)-SWCNT-R | $E_{11}$ (nm) | $E_{11}^-$ (nm) | ΔE (meV) | Source of Precursor | —X |
|---|---|---|---|---|---|
| —$CF_2CF_2CF_2CF_2CF_2CF_3$ | 981 | 1155 | 190 | Sigma Aldrich | I |
| —$CF_2CF_2CF_2CF_3$ | 979 | 1155 | 193 | Sigma Aldrich | I |
| —$CF_3$ | 980 | 1158 | 194 | Sigma Aldrich | I |
| >$CF_2$ | 980 | 1164 | 200 | SynQuest Lab | $I_2$ |

Experimental Methods

Aqueous Dispersions of Individual SWCNT Crystals

SWCNTs (HiPco batch #194.3 (Rice University; or CoMoCAT SG65i Lot # 000-0036, SouthWest NanoTechnologies, Inc.) were stabilized by 1 wt. % sodium dodecyl sulfate (Sigma Aldrich, ≥98.5%) in deuterium oxide ($D_2O$, Cambridge Isotope Laboratories, Inc., 99.8%) by tip ultrasonication (Misonix) at 35 W, 10° C. in a stainless steel beaker for 2 hours, followed by ultracentrifugation with an Optima LE-80K Ultracentrifuge (Beckman Coulter) at 170,499 g for 2 hours to remove bundled nanotubes and residual catalysts. The individually dispersed SWCNTs were sorted for high purity (6,5)-SWCNTs using gel chromatography (Liu, H. et al. (2011) "*Large-scale single-chirality separation of single-wall carbon nanotubes by simple gel chromatography*," Nat. Commun. 2), or using the aqueous two phase-assisted separation (Ao, G. et al. (2014) "DNA-Controlled Partition of Carbon Nanotubes in Polymer Aqueous Two-Phase Systems," J. Am. Chem. Soc. 136:10383-10392). The samples were diluted to an optical density of 0.1 at the $E_{11}$ absorption peak of (6,5)-SWCNTs in 1 wt. % SDS in $D_2O$. The concentrations of HiPco and CoMoCAT were determined with a calibration curve from correlated optical density and thermogravimetric analysis. The concentration of chirality-enriched solutions was calculated based on the extinction coefficient previously determined by Zheng et al. (Zheng, M. & Diner, B. A. (2004) "*Solution Redox Chemistry of Carbon Nanotubes*," J. Am. Chem. Soc. 126:15490-15494).

Synthetic Creation of Fluorescent Quantum Defects in SWCNTs

Sodium bicarbonate (EMP Chemicals, ACS grade), acetonitrile (Signal Aldrich, 99.9%) and alkyl halides were added sequentially to each SWCNT solution, which was kept in a capped glass vial covered by aluminum foil. Acetonitrile was used as a co-solvent for the alkyl halide. Sodium dithionite (Sigma Aldrich, 85%) was then added to the mixture and stirred with a magnetic stir bar at room temperature. For aryl defects, only aryl-containing iodides are utilized and the reaction was triggered by optically exciting the $E_{22}$ transition of the nanotubes for single valent groups. The degree of functionalization was controlled by adjusting the relative amounts of reagents. The reaction was monitored at various times by UV-Vis-NIR absorption and fluorescence spectroscopy.

In situ UV-Vis-NIR absorption and photoluminescence spectroscopy

The reactions were monitored in situ using a Lambda 1050 UV-Vis-NIR spectrophotometer (Perkin Elmer), which is equipped with both a PMT detector and an extended InGaAs detector, and a NanoLog spectrofluorometer (Horiba Jobin Yvon). For fluorescence spectroscopy, the samples were excited with a 450 W Xenon source dispersed by a double-grating monochromator. Excitation-emission maps and fluorescence spectra were collected using a liquid-$N_2$ cooled linear InGaAs array detector on a 320 mm imaging spectrometer. The spectrofluorometer was calibrated against NIR emission lines of a pencil-style neon spectral calibration lamp (Newport).

Resonant Raman scattering and X-ray photoelectron spectroscopy

The SWCNTs were precipitated out from solution and deposited on glass slides for Raman scattering or gold-coated silicon substrates for XPS measurement. XPS was taken with Kratos Axis 165 at 25° C. and 175° C. under an ultrahigh vacuum (<$1 \times 10^{-8}$ Torr). Raman spectra were measured on a LabRAM ARAMIS Raman microscope (Horiba Scientific). The samples were excited with a He—Ne (632.8 nm) laser or a 532 nm laser at a power density of 0.014-0.14 mW $\mu m^{-2}$. Each spectrum was obtained by averaging the data collected from three different spots. Absorption and PL spectra were fitted with Voigt functions using PeakFit software v4.12. No baseline correction was applied during the fitting for PL while a linear background correction was used for the E22 absorption.

Creation of Alkylated Fluorescent Quantum Defects

Our starting material was (6,5)-SWCNTs approximately 0.75 nm in diameter and 500 nm in length (or 125 unit cells) on average. Note that our chemistry readily extends to other nanotube chiralities. However, (6,5)-SWCNT was chosen for some testing due to its synthetic abundance and established literature.

The (6,5)-SWCNTs have intrinsic absorption and photoluminescence peaks at 979 nm ($E_{11}$) and 568 nm (E22), which arise from their excitonic transitions (FIG. 2) (O'Connell, M. J. (2002) "*Band Gap Fluorescence from Individual Single-Walled Carbon Nanotubes*," Science 297: 593-596). Covalent attachment of perfluorinated hexyl groups to the nanotubes produced a bright defect PL peak ($E_{11}^-$) at 1155 nm. The observed peak was redshifted from the parent nanotube PL ($E_{11}$) by 177 nm (ΔE=190 meV), and the full width at half-maximum (FWHM) of the peak increased from 37 meV to 69 meV. This new feature arose within minutes of the start of the reaction, and reached the maximum after about 12 minutes and then plateaued in about 25 minutes. The bright feature remained stable over at least nine months under ambient conditions (FIG. 2, Panel c).

Concluding Remarks

Utilizing the disclosed system and methodologies, the chemical synthesize of a new series of quantum emitters was demonstrated from semiconducting SWCNTs of the same chirality through molecular engineering of covalently attached functional groups.

As noted above, (6,5)-SWCNTs were utilized in various embodiments and testing. However, the disclosed methodologies readily extend to various SWCNT species. For example, ΔE data of twelve SWCNT species functionalized with perfluorinated hexyl group is provided in Table 5:

TABLE 5

Quantum defect near-infrared emitters synthesized from
—$CF_2(CF_2)_4CF_{13}$ tailored SWCNTs of different chiralities.
The energy difference between $E_{11}$ and $E_{11^-}$ emission is denoted as ΔE.

| Chirality | Chiral angle (deg) | diameter (nm) | $E_{11}$ (nm) | $E_{11^-}$ (nm) | ΔE (meV) |
|---|---|---|---|---|---|
| (5, 4) | 26.3 | 0.62 | 842 | 1027 | 265 |
| (6, 4) | 23.4 | 0.69 | 879 | 1082 | 264 |
| (7, 3) | 17 | 0.71 | 999 | 1190 | 198 |
| (9, 1) | 5.21 | 0.76 | 926 | 1127 | 239 |
| (6, 5) | 27 | 0.76 | 979 | 1152 | 190 |
| (8, 3) | 15.3 | 0.78 | 955 | 1169 | 238 |
| (7, 5) | 24.5 | 0.83 | 1032 | 1206 | 173 |
| (8, 4) | 19.1 | 0.84 | 1112 | 1284 | 149 |
| (7, 6) | 27.5 | 0.90 | 1133 | 1291 | 134 |
| (9, 4) | 17.48 | 0.916 | 1114 | 1270 | 137 |
| (11, 1) | 4.32 | 0.916 | 1277 | 1487 | 137 |
| (10, 3) | 12.73 | 0.936 | 1260 | 1445 | 126 |

This new class of synthetic quantum systems shows molecular-specific optical and electronic properties that are distinctly different from existing nanostructures. Given the rich molecular moieties and recent experimental advances in synthesis and sorting of single-chirality SWCNTs (Tu, X. et al. (2009) "*DNA sequence motifs for structure-specific recognition and separation of carbon nanotubes,*" Nature 460: 250-253; Sanchez-Valencia, J. R. e et al. (2014) "*Controlled synthesis of single-chirality carbon nanotubes,*" Nature 512: 61-64), a large variety of near-infrared quantum emitters may be readily designed and chemically created for numerous applications, such as in vivo bioimaging and sensing applications.

All identified publications and references are herein incorporated by reference to the same extent as if each individual publication was specifically and individually indicated to be incorporated by reference in its entirety. While the invention has been described in connection with exemplary embodiments thereof, it will be understood that it is capable of further modifications and this application is intended to cover any variations, uses, or adaptations of the invention following, in general, the principles of the invention and including such departures from the present disclosure as come within known or customary practice within the art to which the invention pertains and as may be applied to the features hereinbefore set forth.

What is claimed is:

1. A method of synthesizing a near infrared emitter comprising the steps of:
   reacting a carbon nanostructure with a halogen-containing hydrocarbon precursor and thereby creating $sp^3$ defects in said carbon nanostructure,
   wherein covalent functionalization produces fluorescent defects that emit near-infrared radiation having wavelengths between about 800 nm and about 2500 nm.

2. The method of claim 1, wherein said carbon nanostructure is a carbon nanotube (CNT).

3. The method of claim 2, wherein said CNT has a diameter of between about 0.5 nm and about 1.6 nm.

4. The method of claim 1, wherein said $sp^3$ defects are created in a pristine carbon nanostructure during said reacting step.

5. The method of claim 1, wherein said halogen-containing hydrocarbon precursor is a chlorine, a bromide, an iodide or a di-halide alkyl precursor.

6. The method of claim 1, wherein said halogen-containing hydrocarbon precursor is a polymer containing the reactive halogen.

7. The method of claim 6, wherein said halogen-containing hydrocarbon precursor is a polyoligonucleotide containing the reactive halogen.

8. The method of claim 1, wherein said halogen-containing hydrocarbon precursor is an alkyl halide.

9. The method of claim 5, wherein said reacting step further comprises combining said carbon nanostructure with sodium dithionite ($Na_2S_2O_4$), said sodium dithionite activating said alkyl precursor.

10. The method of claim 1, wherein said halogen-containing hydrocarbon precursor is an iodide or di-halide aryl precursor.

11. The method of claim 10, comprising exposing said carbon nanostructure and said aryl precursor to electromagnetic radiation having a wavelength(s) of between about 300 nm and about 1200 nm and resonant with said carbon nanostructures, said electromagnetic radiation activating said aryl precursor.

12. The method of claim 1, wherein said created $sp^3$ defects are selected from the group consisting of monovalent alkyl defects, divalent alkyl defects, monovalent aryl defects, and divalent aryl defects.

13. The method of claim 1, wherein said covalently functionalized carbon nanostructure is functionalized with an alkyl group or an aryl group.

14. The method of claim 1, wherein said covalently functionalized carbon nanostructure is functionalized with —$(CH_2)_n(CF_2)_mCF_3$, wherein n is an integer between 0 and 10, and wherein m is an integer between 0 and 10.

15. The method of claim 1, wherein said covalently functionalized carbon nanostructure is functionalized with —$(CH_2)_nCH_3$, wherein n is an integer between 0 and 17.

16. A synthetic near-infrared emitter, comprising:
    a carbon nanostructure comprising $sp^3$ defects in a carbon lattice thereof and created via reaction with a halogen-containing hydrocarbon precursor; and
    a functional group covalently bonded to said $sp^3$ defects to produce fluorescent defects that emit near-infrared radiation having wavelengths between about 800 nm and about 2500 nm.

17. The near-infrared emitter of claim 16, wherein said carbon nanostructure is a carbon nanotube (CNT).

18. The near-infrared emitter of claim 16, wherein said CNT has a diameter of between about 0.5 nm and about 1.6 nm.

19. The near-infrared emitter of claim 16, wherein said functional group is selected from the group consisting of a monovalent alkyl group, a divalent alkyl group, a monovalent aryl group, and a divalent aryl group.

20. The near-infrared emitter of claim 16, wherein said functional group is —$(CH_2)_n(CF_2)_mX$, wherein n is an integer between 0 and 17, and wherein m is an integer between 0 and 17, and wherein X is $CH_3$, $CF_3$, $NH_2$, $N^+(CH_2CH_3)_2$, or COOH.

21. The near-infrared emitter of claim 16, wherein said functional group is —$(CH_2)_nCH_3$, wherein n is an integer between 0 and 10.

* * * * *